US009768746B2

(12) United States Patent
Zalisk et al.

(10) Patent No.: US 9,768,746 B2
(45) Date of Patent: Sep. 19, 2017

(54) USER INTERFACES AND RELATED DEVICES AND SYSTEMS

(71) Applicant: Bose Corporation, Framingham, MA (US)

(72) Inventors: Michael Andrew Zalisk, Arlington, MA (US); John Michael Sakalowsky, West Newton, MA (US); Joel H. Miller, Westborough, MA (US)

(73) Assignee: Bose Corporation, Framingham, MA (US)

( * ) Notice: Subject to any disclaimer, the term of this patent is extended or adjusted under 35 U.S.C. 154(b) by 860 days.

(21) Appl. No.: 14/023,011

(22) Filed: Sep. 10, 2013

(65) Prior Publication Data

US 2015/0071465 A1 Mar. 12, 2015

(51) Int. Cl.
| | | |
|---|---|---|
| *G09F 27/00* | (2006.01) | |
| *H03G 3/02* | (2006.01) | |
| *G05G 1/01* | (2008.04) | |
| *G05G 1/10* | (2006.01) | |
| *G05G 1/02* | (2006.01) | |

(Continued)

(52) U.S. Cl.
CPC ............... *H03G 3/02* (2013.01); *G05G 1/01* (2013.01); *G05G 1/025* (2013.01); *G05G 1/10* (2013.01); *G06F 3/0312* (2013.01); *G06F 3/0362* (2013.01); *G06F 3/04847* (2013.01); *G08C 17/00* (2013.01); *H03K 17/962* (2013.01); *G06F 3/04883* (2013.01); *G08C 2201/30* (2013.01); *H03K 2217/960755* (2013.01); *Y10T 74/20474* (2015.01)

(58) Field of Classification Search
CPC ...... G05G 1/105; G06F 3/0362; G06F 2/0312
See application file for complete search history.

(56) References Cited

U.S. PATENT DOCUMENTS

| | | | |
|---|---|---|---|
| 2,550,483 A * | 4/1951 | Jones | H03J 1/02 |
| | | | 348/836 |
| 5,012,056 A | 4/1991 | Abel et al. | |

(Continued)

FOREIGN PATENT DOCUMENTS

| | | |
|---|---|---|
| DE | 20102197 U1 | 6/2001 |
| DE | 102004031659 A1 | 6/2006 |

(Continued)

OTHER PUBLICATIONS

International Search Report and Written Opinion dated Mar. 27, 2015 for International Application No. PCT/US2014/054715.

(Continued)

*Primary Examiner* — Duc Nguyen
*Assistant Examiner* — Kile Blair

(57) ABSTRACT

A user interface includes a rotatable ring for controlling a function on an associated device, and a support ring for supporting the rotatable ring. The support ring includes a plurality of biasing elements, and a plurality of engagement members rotatably mounted on the biasing elements and configured to engage the rotatable ring so as to preload the biasing elements and thereby (i) biasing the rotatable ring toward a center position in which a central axis of the rotatable ring is coincident with a central axis of the support ring, and (ii) increasing resistance to rotational movement of the rotatable ring.

47 Claims, 27 Drawing Sheets

(51) Int. Cl.
  *G06F 3/03*     (2006.01)
  *H03K 17/96*    (2006.01)
  *G06F 3/0362*   (2013.01)
  *G06F 3/0484*   (2013.01)
  *G08C 17/00*    (2006.01)
  *G06F 3/0488*   (2013.01)

(56) References Cited

U.S. PATENT DOCUMENTS

| | | | |
|---|---|---|---|
| 6,809,661 B1 | 10/2004 | Badarneh | |
| 7,437,211 B1* | 10/2008 | Haas | G05B 19/409 |
| | | | 700/168 |
| 7,499,040 B2 | 3/2009 | Zadesky et al. | |
| D625,295 S | 10/2010 | Nogueira et al. | |
| 8,164,009 B2 | 4/2012 | Kagami et al. | |
| 8,195,313 B1* | 6/2012 | Fadell | F24F 11/0009 |
| | | | 236/1 C |
| 8,274,479 B2 | 9/2012 | Prest et al. | |
| 8,723,808 B2* | 5/2014 | Kim | G06F 3/04886 |
| | | | 345/173 |
| 2003/0122698 A1* | 7/2003 | Horie | G06F 3/0231 |
| | | | 341/176 |
| 2004/0233159 A1 | 11/2004 | Badarneh | |
| 2006/0181517 A1 | 8/2006 | Zadesky et al. | |
| 2006/0255683 A1 | 11/2006 | Suzuki et al. | |
| 2007/0291016 A1 | 12/2007 | Philipp | |
| 2008/0222546 A1 | 9/2008 | Mudd et al. | |
| 2010/0053464 A1* | 3/2010 | Otsuka | G08C 17/02 |
| | | | 348/734 |
| 2010/0060492 A1 | 3/2010 | Zhou et al. | |
| 2012/0306794 A1 | 12/2012 | Prest et al. | |

FOREIGN PATENT DOCUMENTS

| | | |
|---|---|---|
| EP | 0911750 A2 | 4/1999 |
| EP | 1176499 A1 | 1/2002 |
| EP | 2073232 A2 | 6/2009 |
| EP | 2151843 A1 | 2/2010 |
| JP | 60059556 A | 12/1985 |
| JP | H05233146 A | 9/1993 |
| JP | 2004039797 A | 2/2004 |
| WO | 03046822 A1 | 6/2003 |
| WO | 2009139467 A1 | 11/2009 |
| WO | 2010046372 A1 | 4/2010 |

OTHER PUBLICATIONS

Invitation to Pay Additional Fees dated Dec. 23, 2014 for International Application No. PCT/US2014/054715.

* cited by examiner

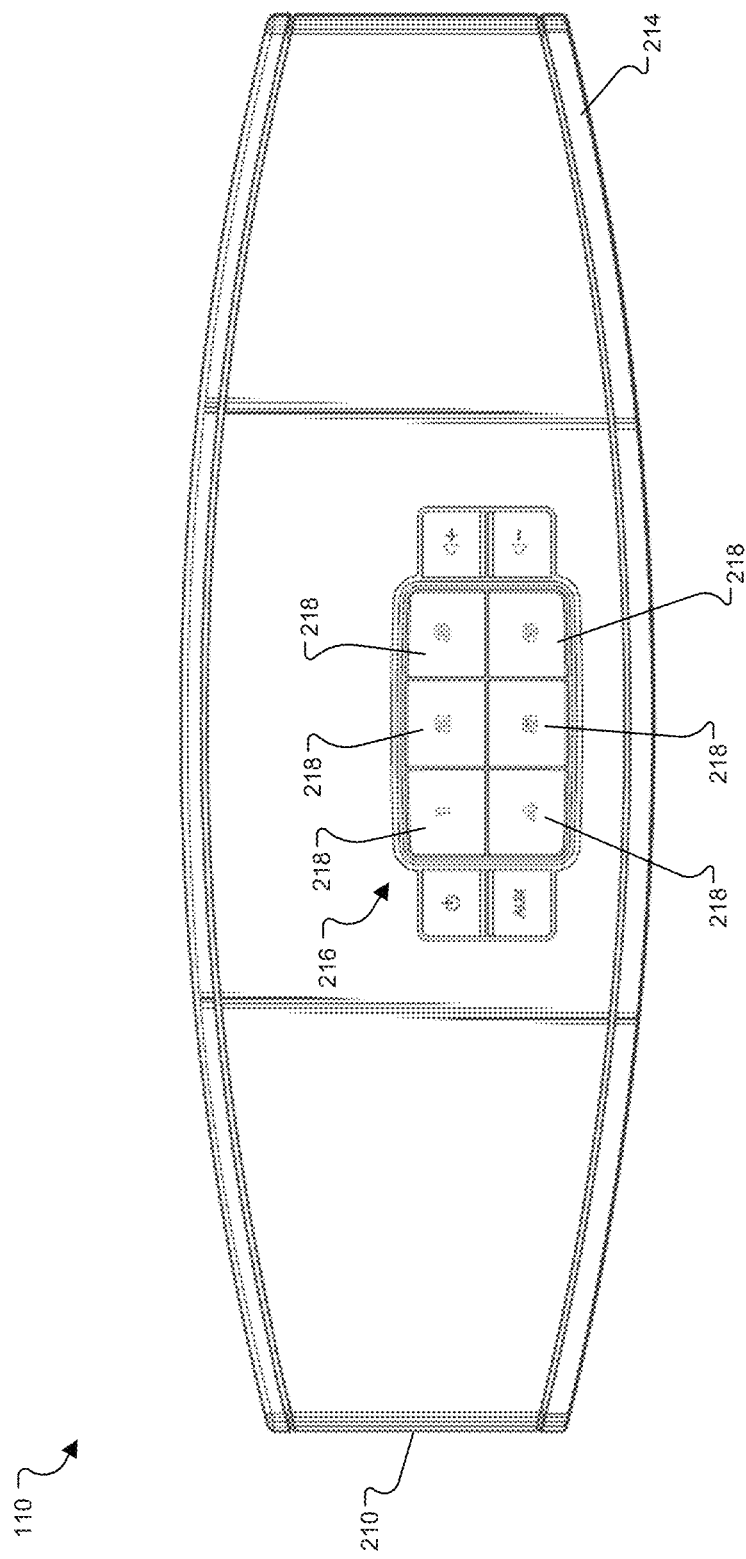

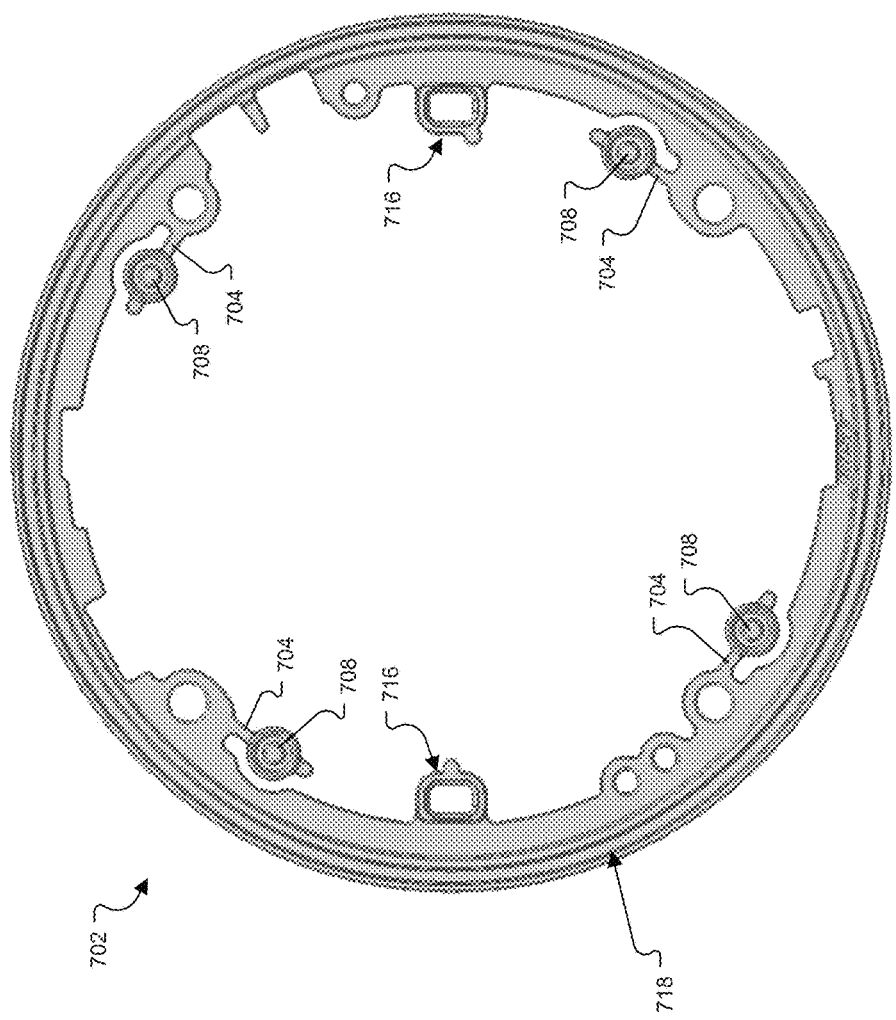

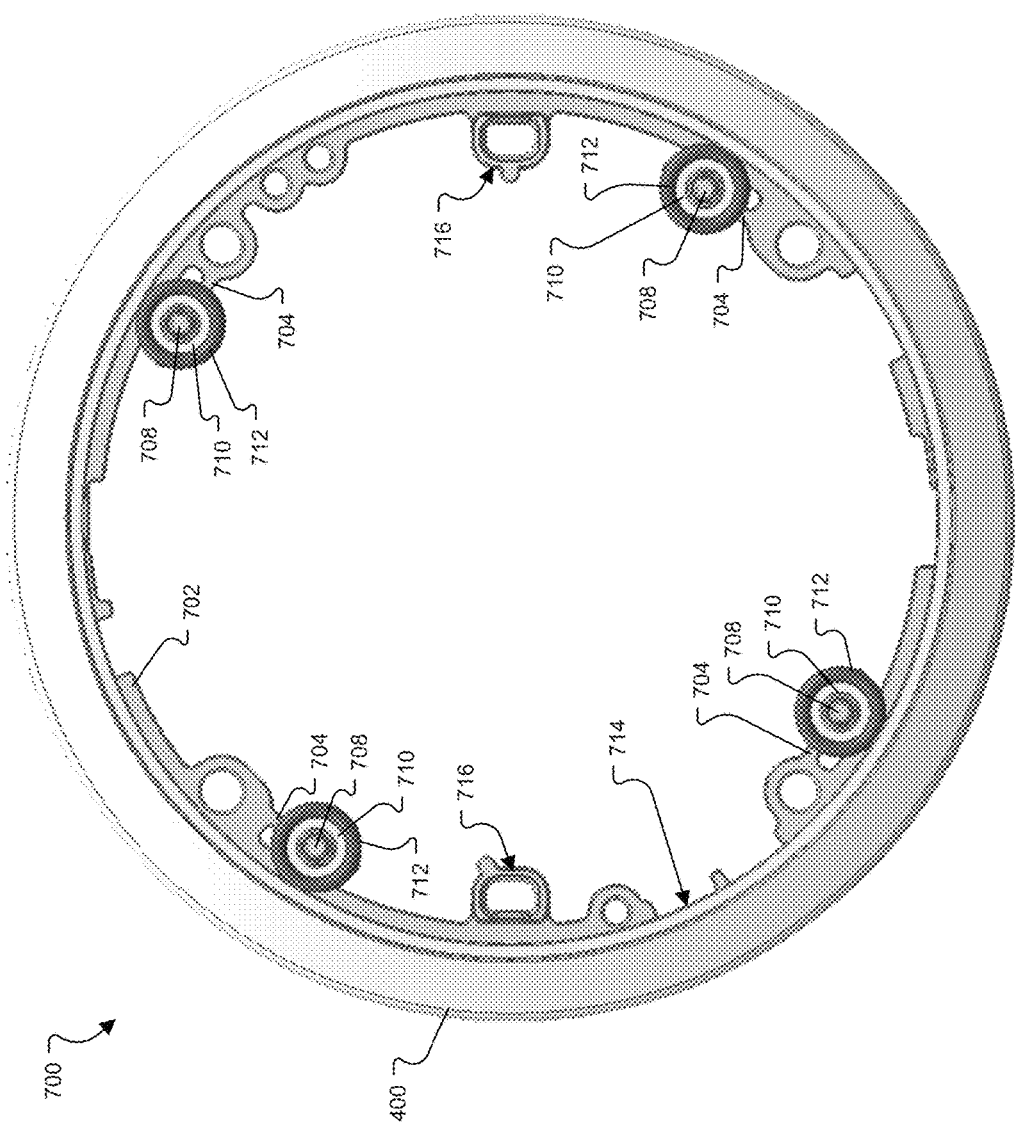

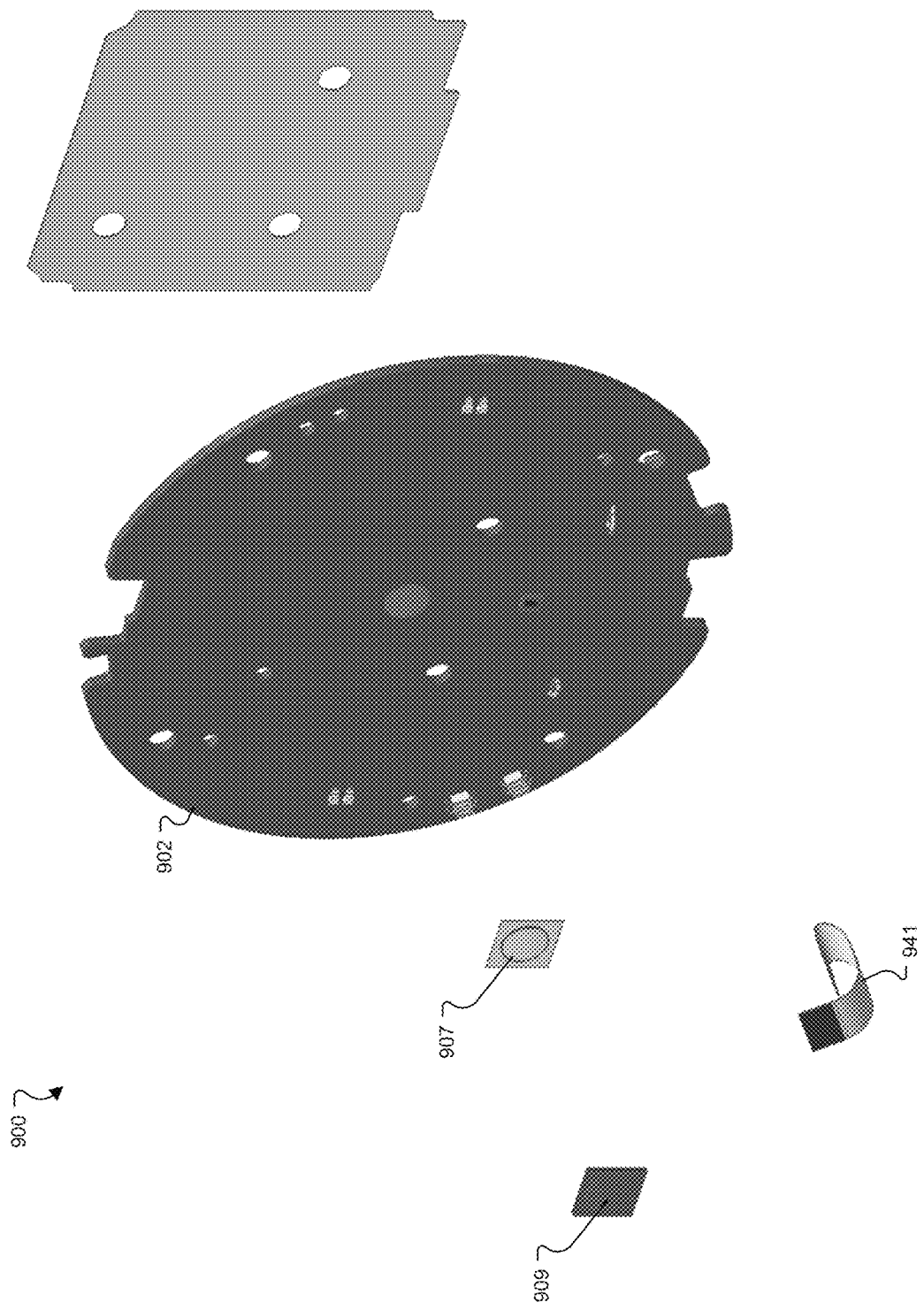

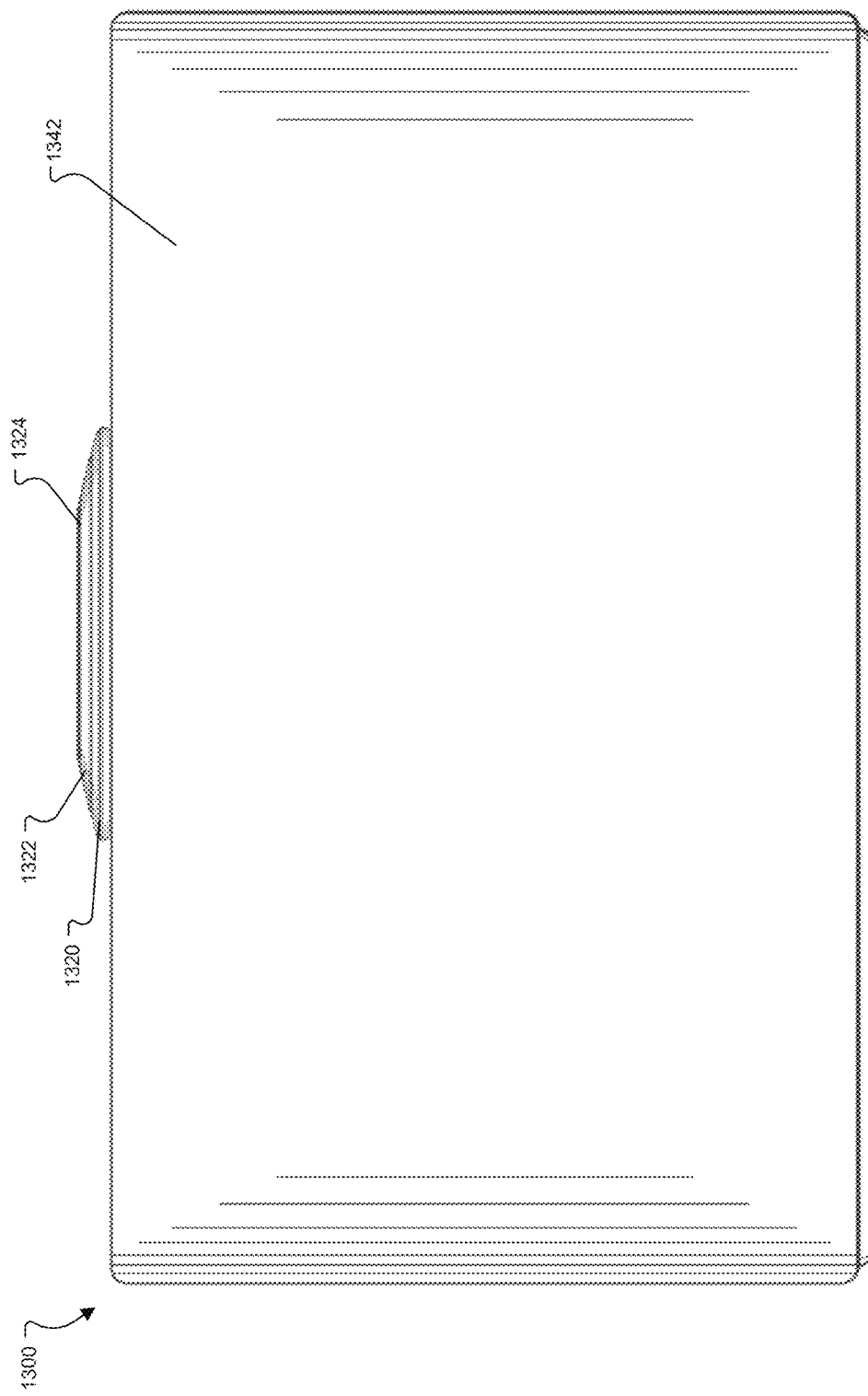

USER INTERFACES AND RELATED DEVICES AND SYSTEMS

BACKGROUND

This disclosure relates to user interfaces and related devices and systems, and, particularly, to user interfaces for remote control devices for use in controlling audio playback devices in audio systems and to user interfaces for audio playback devices.

SUMMARY

In one aspect, a user interface includes a rotatable ring for controlling a function on an associated device, and a support ring for supporting the rotatable ring. The support ring includes a plurality of biasing elements, and a plurality of engagement members rotatably mounted on the biasing elements and configured to engage the rotatable ring so as to preload the biasing elements and thereby (i) biasing the rotatable ring toward a center position in which a central axis of the rotatable ring is coincident with a central axis of the support ring, and (ii) increasing resistance to rotational movement of the rotatable ring.

Implementations may include one of the following features, or any combination thereof.

In some implementations, the rotatable ring includes an encoded pattern and the remote control includes one or more sensors for reading the encoded pattern to sense rotational movement of the rotatable ring.

In certain implementations, at least one of the engagement members includes a wheel rotatable relative to an associated one of the biasing elements, and a compliant member disposed about an outer diameter of the wheel.

In some implementations, the rotatable ring is rotatable to control audio volume on an associated audio playback device.

In certain implementations, the support ring defines a grease trough for retaining grease.

In some implementations, the rotatable ring includes a rib that is configured to rotate within the trough.

In certain implementations, the biasing elements include spring arms.

According to another aspect, a remote control includes user interface that includes a rotatable ring for controlling a function on an associated device, and a support ring for supporting the rotatable ring. The support ring includes a plurality of biasing elements, and a plurality of engagement members rotatably mounted on the biasing elements and configured to engage the rotatable ring so as to preload the biasing elements and thereby (i) biasing the rotatable ring toward a center position in which a central axis of the rotatable ring is coincident with a central axis of the support ring, and (ii) increasing resistance to rotational movement of the rotatable ring.

Implementations may include one of the above and/or below features, or any combination thereof.

In certain implementations, the remote control device also includes a wireless interface for communicating with an associated audio playback device.

In some implementations, the wireless interface is configured to communicate with an associated audio playback device via a Bluetooth protocol.

According to another aspect, an audio playback device includes user interface that includes a rotatable ring for controlling a function on an associated device, and a support ring for supporting the rotatable ring. The support ring includes a plurality of biasing elements, and a plurality of engagement members rotatably mounted on the biasing elements and configured to engage the rotatable ring so as to preload the biasing elements and thereby (i) biasing the rotatable ring toward a center position in which a central axis of the rotatable ring is coincident with a central axis of the support ring, and (ii) increasing resistance to rotational movement of the rotatable ring.

Implementations may include one of the above and/or below features, or any combination thereof.

In another aspect, a user interface includes a plurality of concentrically arranged user interface elements. The user interface elements include a volume ring, a middle ring comprising a plurality of discrete buttons, an inner ring comprising an infinite position sensor, and a center button comprising a display. The inner ring circumferentially surrounds the center button, the middle ring circumferentially surrounds the inner ring, and the volume ring circumferentially surrounds the middle ring.

Implementations may include one of the above and/or below features, or any combination thereof.

In some implementations, the user interface includes a support ring for supporting the volume ring. The support ring includes a plurality of biasing elements, and a plurality of engagement members mounted for rotation on the biasing elements and configured to engage the rotatable ring so as to preload the biasing elements and thereby (i) biasing the rotatable ring toward a center position in which an axis of rotation of the rotatable ring is coincident with a central axis of the support ring, and (ii) increasing resistance to rotational movement of the rotatable ring.

In certain implementation the plurality of discrete buttons comprise a plurality of capacitive touch buttons.

In some implementations, at least one of the capacitive touch buttons includes a backlit icon.

In certain implementations, the plurality of discrete buttons include a presets/recents modal button for toggling between a preset mode in which a user can access presets, wherein the presets are a set of user-defined shortcuts to entities for providing content, and a recents mode in which a user can access a list of previously accessed entities for providing content.

In some implementations, the plurality of discrete buttons include: (i) a skip forward button, and (ii) a skip back button.

In certain implementations, the inner ring includes an infinite position sensor for sensing a position of a user's finger on a surface of the inner ring.

In some implementations, the inner ring operates as an absolute location of a plurality of preset indicators.

In some examples, the preset indicators correspond to a set of preset indicators on an associated audio playback device.

In certain implementations, the center button is displaceable to actuate a switch. The user interface is configured to interpret actuation of the switch, in the absence of input from the infinite position sensor indicating a position of a user's finger relative to the inner ring, as selection of a function associated with the center button. The user interface is configured to interpret actuation of the switch in combination with input from the infinite position sensor indicating a position of a user's finger relative to the inner ring as selection of a preset.

In some implementations, a circular swiping motion along the infinite position sensor allows a user to browse a recents list, wherein the recents list is a list of entities that is populated from content that the user has chosen to play on one or more audio playback devices.

In certain implementations, the center button is displaceable to actuate a switch and the user interface is configured to interpret actuation of the switch, in the absence of input from the infinite position sensor indicating a position of a user's finger relative to the inner ring, as selection of a function associated with the center button. The user interface is configured to interpret actuation of the switch in combination with input from the infinite position sensor indicating a position of a user's finger relative to the inner ring as selection of an entity from the list of entities.

In some implementations, the user interface device is operable in a presets mode and a recents mode. When the user interface is in the presets mode, the inner ring operates as an absolute location of a plurality of preset indicators, which correspond to a set of preset indicators on an associated audio playback device. When the user interface is in a recents mode, a circular swiping motion along the infinite position sensor allows a user to browse a recents list, wherein the recents list is a list of entities that is populated from content that the user has chosen to play on one or more audio playback devices at least one of the audio playback devices being associated with the user interface.

In certain implementations, the center button includes a lens which covers the display.

In some implementations, a central push on the center button can be actuated to (i) power on an associated audio playback device or (ii) to pause and unpause a rendering of audio on an associated audio playback device.

In certain implementations, a press-and-hold on the center button shuts down the associated audio playback device.

In some implementations, the center button is displaceable to actuate a switch and the switch comprises a snap dome.

In certain implementations, the user interface is configured to interpret actuation of the switch, in the absence of input from the inner ring, as selection of a function associated with the center button.

In some implementations, the user interface is configured to interpret actuation of the switch in combination with input from inner ring as selection of a preset.

In certain implementations, the user interface is configured to interpret actuation of the switch in combination with input from the infinite position sensor indicating a position of a user's finger relative to the inner ring as selection of an entity from a recents list, wherein the recents list is a list of entities that is populated from content that the user has chosen to play on one or more audio playback devices within an audio system.

In some implementations, the user interface is configured to display, on the display, information relating to an entity for providing content to be rendered on an associated audio playback device.

In certain implementations, the displayed information may include an identification of an audio source with which the entity is associated, and metadata associated with the entity.

In some implementations, the identification of the audio source may include an icon associated with the audio source.

In certain implementations, the displayed information relates to an entity currently providing content for rendering on an associated audio playback device.

In some implementations, the displayed information relates to an entity assigned to one of a plurality of preset indicators on the inner ring, wherein the plurality of preset indicators one the inner ring correspond to a set of preset indicators on an associated audio playback device.

In some implementations, the displayed information relates to an entity selected from a recents list, wherein the recents list is a list of entities that is populated from content that the user has chosen to play on one or more audio playback devices within an audio system.

In another aspect, a remote control device includes a plurality of concentrically arranged user interface elements. The user interface elements include a volume ring, a middle ring comprising a plurality of discrete buttons, an inner ring comprising an infinite position sensor, and a center button comprising a display. The inner ring circumferentially surrounds the center button, the middle ring circumferentially surrounds the inner ring, and the volume ring circumferentially surrounds the middle ring.

Implementations may include one of the above and/or below features, or any combination thereof.

In certain implementations, the remote control device includes a wireless interface for communicating with an associated audio playback device.

In some implementations, the wireless interface is configured to communicate with an associated audio playback device via a Bluetooth protocol.

In certain implementations, the remote control device includes a proximity detector. The remote control device is configured to enter a low power state, in which one or more functions are deactivated, after a period of non-use, and the remote control device is configured to re-activate the one or more deactivated functions in response to the proximity detector detecting a user's hand near a surface of the remote control device. Another aspect provides a system includes a remote control device, as described above, and a mount. The remote control device includes a battery door comprising a metal portion, and a notch. The mount is configured to be mounted on a wall and includes a magnet for attracting the metal portion of the battery door, and a tab for engaging the notch in the battery door for orientation of the remote control device relative to the mount.

According to another aspect, an audio playback device comprises a plurality of concentrically arranged user interface elements. The user interface elements include a volume ring, a middle ring comprising a plurality of discrete buttons, an inner ring comprising an infinite position sensor, and a center button comprising a display. The inner ring circumferentially surrounds the center button, the middle ring circumferentially surrounds the inner ring, and the volume ring circumferentially surrounds the middle ring.

Implementations may include one of the above and/or below features, or any combination thereof.

Another aspect features an audio system that includes a remote control device, and an audio playback device associated with the remote control device. The remote control device includes a plurality of concentrically arranged user interface elements. The user interface elements include i.) a center button that includes a display; ii.) an inner ring that circumferentially surrounds the center button and includes an infinite position sensor; iii.) a middle ring that circumferentially surrounds the inner ring and includes a plurity of discrete buttons, and iv.) a volume ring that circumferentially surrounds the middle ring. The audio playback device is configured to operably connect to a plurality of digital audio sources. The audio playback device includes a digital-to-analog converter configured to receive a digital representation of content from the digital audio sources and convert to analog form, an electro-acoustic transducer, and a set of user-selectable preset indicators. Each indicator in the set of preset indicators is configured to have assigned to it an entity associated with the plurality of digital audio sources. The audio playback device also includes an other display.

The remote control device is configured to display, on the display, information relating to an entity for providing content to be rendered on the audio playback device, and the audio playback device is configured to display, on the other display, substantially the same information associated with the entity as displayed by the remote control device.

Implementations may include one of the above and/or below features, or any combination thereof.

In some implementations, the audio playback device and the remote control device are configured to concurrently display substantially the same information associated with the entity.

In certain implementations, the audio playback device includes a processor, and instructions stored on a computer-readable media that, when executed, cause the processor to: update one or more preset assignments based on user input, each of the preset assignments representing an assignment of an entity associated with one of the digital audio sources to a corresponding one of the preset indicators; and to provide information regarding the update to the one or more preset assignments to the remote control device. The remote control device is configured to store the information regarding the update to the one or more preset assignments within memory on the remote control device.

Another aspect provides a system includes a remote control device, as described above, and a mount. The remote control device includes a battery door comprising a metal portion, and a notch. The mount is configured to be mounted on a wall and includes a magnet for attracting the metal portion of the battery door, and a tab for engaging the notch in the battery door for orientation of the remote control device relative to the mount.

Implementations may include one of the above features, or any combination thereof.

All examples and features mentioned above can be combined in any technically possible way. Other features and advantages will be apparent from the description and the claims.

BRIEF DESCRIPTION OF THE DRAWINGS

FIGS. 2A and 2B are perspective and top plan views, respectively, of an exemplary audio playback device from the audio system of FIG. 1.

FIG. 7C is a top plan view of a support ring from the volume ring assembly of FIG. 7A.

FIG. 7D is a top plan view of the volume ring assembly of FIG. 7A.

FIG. 9A is a first exploded view of a main printed circuit board (PCB) assembly from the remote control device of FIG. 5.

FIGS. 13A and 13B are top plan and front elevation views, respectively, of another implementation of an audio playback device having an alternative user interface.

DETAILED DESCRIPTION

System Overview

Figure 1:
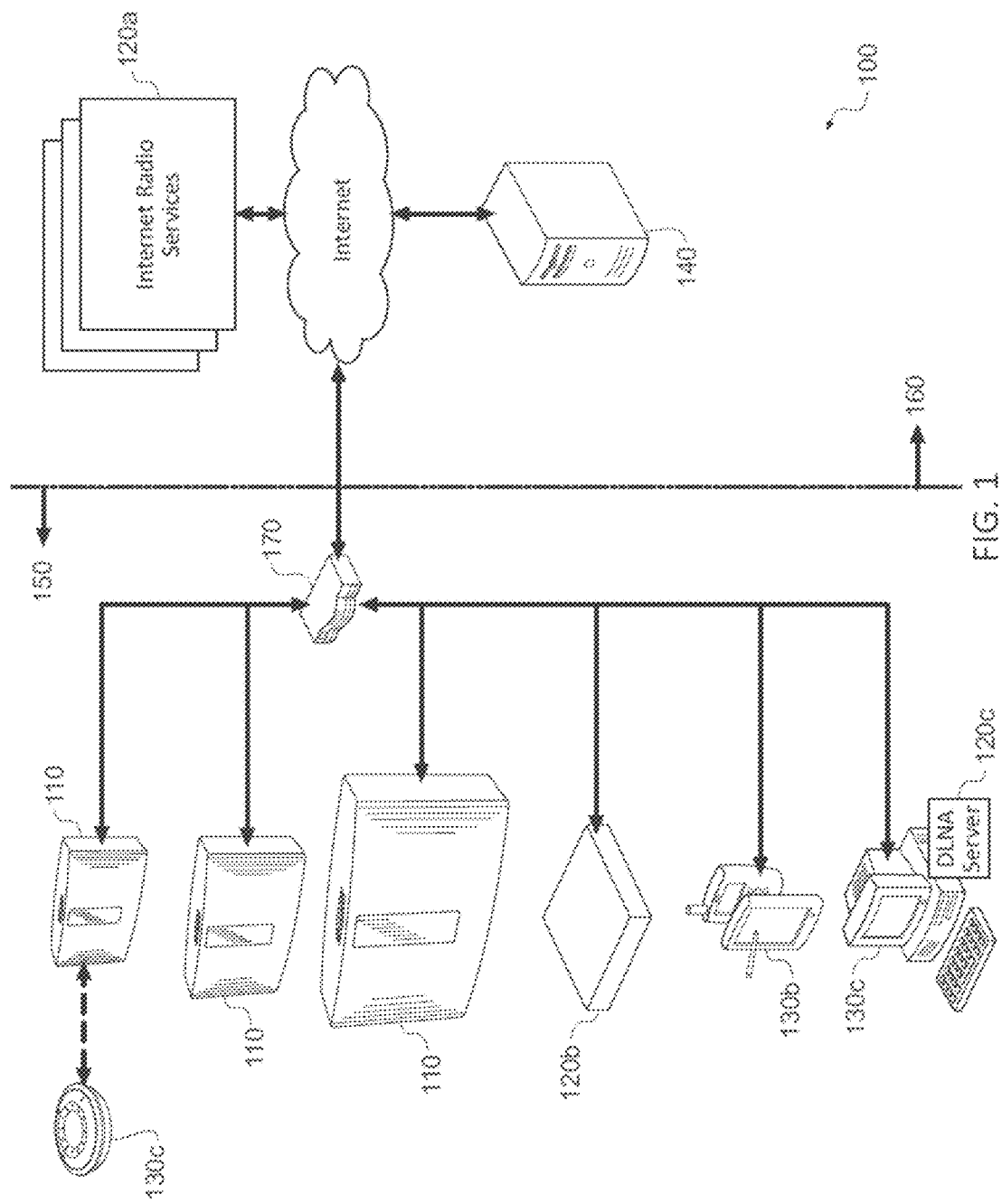
FIG. 1 is a schematic view of an audio system that facilitates synchronization of presets among various system devices.

Referring to FIG. 1, an audio system 100 for the delivery of digital audio (e.g., digital music) provides for easy, quick access to a variety of digital audio sources through the use of preset assignments. At a very high level, there are four main categories of devices in the audio system 100: (i) audio playback devices 110; (ii) digital audio sources 120a, 120b, 120c (collectively referenced as 120); controllers 130a, 130b, 130c (collectively referenced as 130); and a server 140.

The audio playback devices 110 are electronic devices which are capable of rendering audio content. These devices can access stored audio content (e.g., remotely stored audio content) and stream it for playback. In some cases, the audio playback devices 110 may also be capable of playing locally stored content. These devices render audio with the help of audio codecs and digital signal processors (DPSs) available within. The audio playback devices 110 may include wireless speaker packages, Wi-Fi enabled televisions, home theater systems (e.g., with built-in Wi-Fi), etc.

The audio playback devices 110 can communicate with each other. For example, each audio playback device 100 can communicate with the other audio playback devices 110 within the audio system 100 for synchronization. This can be a synchronization of device settings, such as synchronization of preset assignments, or, for synchronization of playback (e.g., such that all or a subset of the audio playback devices 110 play the same content simultaneously and synchronously).

The digital audio sources 120 are devices and/or services that provide access to one or more associated entities for supplying content (e.g., audio streams) to the audio playback devices 110, and which can be located remotely from the audio playback devices 110. An "Entity," as used herein, refers to a grouping or collection of content for playback. Exemplary entities include Internet radio stations and user defined playlists. "Content" is data (e.g., an audio track) for playback. "Associated entity" refers to an entity that is associated with a particular audio source. For example, if the digital audio source 120 is an Internet music service such as Pandora®, an example associated entity would be a radio station provided by Pandora®.

For the purposes of the audio system 100, audio streams are considered to be data. They are processed as digital information that is converted to analog before presentation. Data streaming is the method by which data is moved from an audio source 120 to an audio playback device 110. Typically, there are two models for this data movement, push and pull. The audio system 100 is capable of managing this audio (data) streaming in both fashions; descriptions of these processes are as follows.

In a push model, the digital audio source 120 will move the data to the audio playback device 110 at a pace that it desires. The recipient (e.g., one of the audio playback devices 110) of the data will acknowledge the data and the digital audio source 120 will provide more data. This model requires the digital audio source 120 to be managing the throughput characteristics of the audio system 100. In a pull model, the audio playback device 110 will request data from the digital audio source 120 at a rate it desires. This allows the audio playback device 110 to read ahead if data is available.

The digital audio sources 120 each maintain a repository of audio content which can be chosen by the user to play. The digital audio sources 120 are based on the Digital Living Network Alliance® (DLNA) or other Web based protocols similar to the Hypertext Transfer Protocol (HTTP). Some of the devices and services in this category include Internet based music services 120a such as Pandora®, Spotify®, and vTuner®; network-attached storage (NAS) devices 120b, and a media server daemon 120c (e.g., provided as a component of a computer-based controller).

The digital audio sources 120 include user defined playlists of digital music files available from network audio sources such as network-attached storage (NAS) devices 120b, and a DLNA server 120c which may be accessible to the audio playback devices 110 over a local area network such as a wireless (Wi-Fi) or wired (Ethernet) home network 150, as well as Internet radio sites 120a such as Pandora®, vTuner®, Spotify®, etc., which are accessible to the audio playback devices 110 over a wide area network 160 such as the Internet.

The controllers 130 are responsible for controlling the audio playback devices 110 and for browsing the audio sources 120 in the audio system 100. Some of the devices in this category include desktop computers, laptop computers, and mobile devices such as smart phones and tablets. These devices control the audio playback devices 110 via a wireless communication interface (e.g., IEEE 802.11 b/g, Bluetooth LE, infrared, etc.). The controllers 130 serve as an online management tool for a user's network enabled audio playback devices 110. The controllers 130 provide interfaces which enable to the user to perform one or more of the following: setup a connection to a Wi-Fi network; create an audio system account for the user, sign into a user's audio system account and retrieve information; add or remove an audio playback device 110 on a user's audio system account; edit an audio playback device's name, and update software; access the audio sources (via the audio playback devices 110); assign an entity (e.g., a playlist or radio station) associated with one of the audio sources 120 to a preset indicator; browse and select recents, where "recents" refers to recently accessed entities; use transport controls (play/pause, next/skip, previous), view "Now Playing" (i.e., content currently playing on an audio playback device 110) and album art; and adjust volume levels.

In some cases, the controllers 130 may include network controllers 130a, 130b and auxiliary controllers 130c (also referred to as remote control devices 130c). The network controllers 130a, 130b are controllers that communicate with the audio playback devices 110 over a wireless (Wi-Fi) network connection. The network controllers can include primary network controllers 130a and secondary network controllers 130b. The primary network controllers 130a can be utilized for: connecting an audio playback device 110 to a Wi-Fi network (via a USB connection between the audio playback device 110 and the primary network controller 130a); creating a system account for the user; setting up music services; browsing of content for playback; setting preset assignments on the audio playback devices 110; transport control (e.g., play/pause, fast forward/rewind, etc.) for the audio playback devices 110; and selecting audio playback devices 110 for content playback (e.g., single room playback or synchronized multi-room playback). Devices in the primary network controller category can include desktop and laptop computers.

The secondary network controllers 130b may offer some, but not all, of the functions of the primary network controllers 130a. For example, the secondary network controllers 130b may not provide for all of the account setup and account management functions that are offered by the primary network controllers 130a. The secondary network controllers 130b may be used for: music services setup; browsing of content; setting preset assignments on the audio playback devices; transport control of the audio playback devices; and selecting audio playback devices 110 for content playback: single room or synchronized multi-room playback. Devices in the secondary network controller category can include mobile devices such as smart phones and tablets.

The auxiliary controllers 130c (a/k/a "remote control devices 130c") communicate wirelessly (e.g., via Bluetooth low energy (BTLE) or IR) with an associated (e.g., paired) one of the audio playback devices (item 110, FIG. 1). The auxiliary controllers 130c may offer limited functionality. The auxiliary controllers 130c may be used for: browsing of content; setting of preset assignments on the associated one of the audio playback devices 110; selecting of one of the preset assignments on the associated one of the audio playback devices 110; and transport control (play/pause, skip forward, skip back, etc.) of the associated audio playback device 110.

The server 140 is a cloud-based server which contains (e.g., within an account database) information related to a user's audio system account. This includes user account information such as the list of the audio playback devices 110 within the system 100, device diagnostic information, preset assignments, etc. The server 140 will be connected to by the audio playback devices 140 and by the controllers 130 (e.g., by primary network controllers) for the purpose of preset management, as well as management of audio sources 120 and management of the user's audio system account. Generally, the controllers 130 (e.g., network controllers 130a, 130b) will login to the server 140 with a user's login details and 'sync down' the required information to work with.

The audio playback devices 110 and one or more of the controllers 130 are coupled to a local area network (LAN) 150. Other devices such as one or more of the digital audio sources (e.g., a network-attached storage (NAS) device 120b) may also be coupled to the LAN 150. The LAN 150 may be a wired network, a wireless network, or a combination thereof. In one example, the devices (e.g., audio playback devices 110 and controllers 130 (e.g., primary and secondary controllers 130a, 130b)) within the LAN 150 are wirelessly coupled to the LAN 150 based on an industry standard such as IEEE 802.11 b/g. The LAN 150 may represent a network within a home, an office, or a vehicle. In the case of a residential home, the audio playback devices 110 may be arranged in different rooms (e.g., kitchen, dining room, basement, etc.) within the home. The devices within the LAN 150 connect to a user supplied access point 170 (e.g., a router) and subsequently to a wide area network (WAN) 160 (e.g., the Internet) for communication with the other digital audio sources 120 (Internet based music services 120a) and the server 140. In some cases, the LAN 150 may comprise plural LANs in different locations each including one or more of the audio playback devices 110 and each in communication with the wide area network.

Notably, the audio system 100 can provide for the management of presets (a/k/a "preset assignments") and recents. Presets are a set of (e.g., six) user-defined shortcuts to content, intended to provide quick access to entities associated with the digital music sources 120 from (1 of 6) preset indicators present on each of the audio playback devices 110. In some cases, the preset indicators can be hardware buttons. Alternatively, the preset indicators may be virtual buttons defined by regions on a touch sensitive display. The individual preset indicators can be denoted with numerical identifiers.

The preset indicators on the audio playback devices 110 provide access to their respectively assigned entities irrespective of the associated digital audio source. More specifically, the preset indicators can provide for single press access to the respectively assigned entities, irrespective of the digital audio source. That is, a single press of a preset indicator will start the streaming and rendering of content from an entity assigned to that preset indicator regardless of the audio source providing that entity. In that regard, the presets are said to be source agnostic in that they behave in the same manner regardless of the audio source. In some cases, the single press access can be facilitated with the distribution of tokens for accessing account based audio sources which normally require a user to login with account credentials.

The presets can be global or local at the user's option. The user can select the global or local option, e.g., during set up of the user's system account. If the user's account is set to provide for global presets, the preset assignments will be synchronized on all the audio playback devices 110 across the audio system 100 such that preset assignments on any one of the audio playback devices correspond to respective preset assignments on each of the other audio playback devices (e.g., such that preset indicator "1" on a first one of the audio playback devices is assigned to the same entity as preset indicator "1" on all of the other audio playback devices 110 in the audio system 100), and, such that, if one of the preset assignments is changed on one of the audio playback devices 110, each of the other audio playback devices 110 is automatically updated such that a corresponding change is made to a corresponding preset assignment on each of the other audio playback devices. The synchronization of the preset assignments is managed through a combination of communications between the audio playback devices 110 with the server 140, and communications among the audio playback devices 110 themselves. A copy of the global preset assignments is stored locally on each audio playback device 110 associated with the user's account, and a copy of the global preset assignments is also maintained on the server 140.

The "recents" (a/k/a "recents list") is a list of entities that is populated from content that the user has chosen to play. Recent entities can include Internet radio stations (e.g., for Pandora® and vTuner®), and a "group of tracks" selected for Spotify® and stored music. The "group of tracks" is a "parent" of a currently playing track, based on whatever the user either browsed to or searched for (e.g., Album, Playlist, Genre >All, Artist >All, etc.). The controllers 130, and, in some cases, the audio playback devices 110, can provide access to the recents by displaying the recents list to the user and allowing the user to browse the recents list and select entities therefrom.

The recents can be limited to a predetermined number of entities (e.g., 50-100 entities). Alternatively or additionally, the recents may be limited by date. For example, the recents may be limited to entities accessed by the user within the last day, month, year, etc., with older entries being purged from the list.

As with the presets, the recents can be global (applied to all audio playback devices associated with a user's account) or local (device-specific) at the user's option. The same local/global toggle can be leveraged for both the presets and the recents. That is, one "global/local" setting can dictate whether the presets and recents are global or local. In some cases, the default setting is "global." Additional details regarding the management of presets and recents are disclosed in U.S. application Ser. No. 13/833,394, filed Mar. 15, 2013, which is incorporated herein by reference in its entirety.

Audio Playback Devices

Figure 2A:
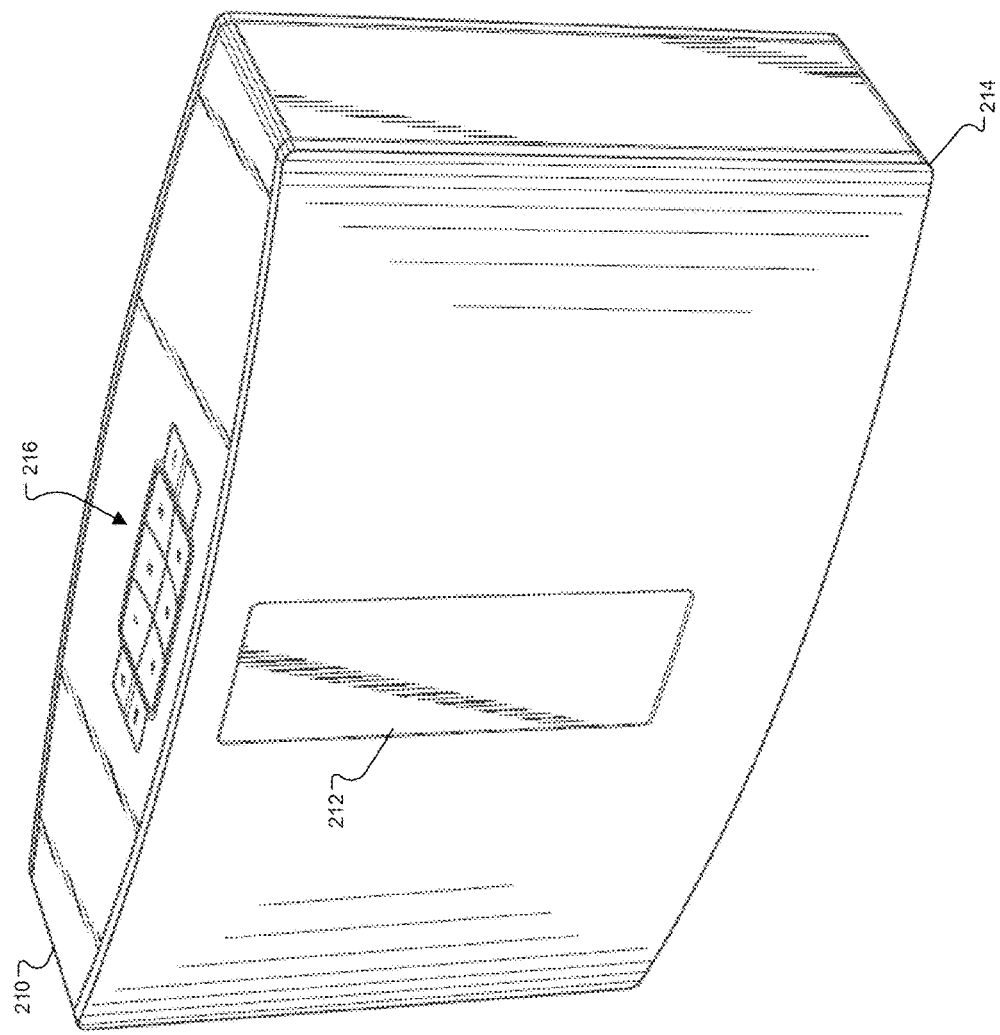
Figure 2C:
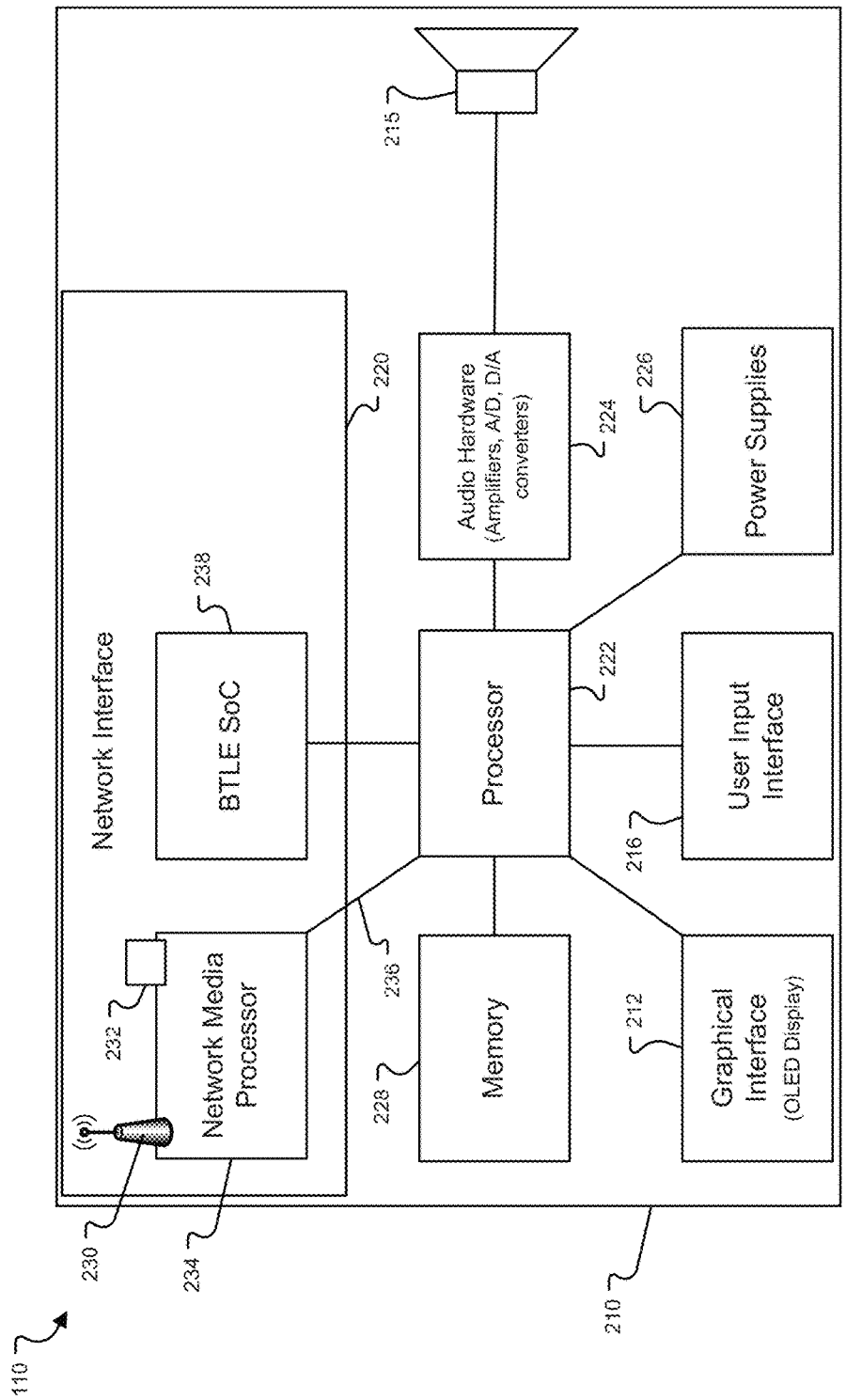
FIG. 2C is a block diagram of the audio playback device of FIG. 2A.

An exemplary audio playback device 110 will now be described in greater detail with reference to FIGS. 2A through 2C. Referring to FIG. 2A, an audio playback device 110 includes an enclosure 210 and on the enclosure 210 there resides a graphical interface 212 (e.g., an OLED display) which can provide the user with information regarding currently playing ("Now Playing") music and information regarding the presets. A screen 214 conceals one or more electro-acoustic transducers 215 (FIG. 2C). The audio playback device 110 also includes a user input interface 216. As shown in FIG. 2B2B, the user input interface 216 includes a plurality of preset indicators 218, which are hardware buttons in the illustrated example. The preset indicators 218 (numbered 1-6) provide the user with easy, one press access to entities assigned to those buttons. That is, a single press of a selected one of the preset indicators 218 will initiate streaming and rendering of content from the assigned entity.

The assigned entities can be associated with different ones of the digital audio sources (items 120a, 120b, 120c, FIG. 1) such that a single audio playback device 110 can provide for single press access to various different digital audio sources. In one example, the assigned entities include at least (i) user-defined playlists of digital music and (ii) Internet radio stations. In another example, the digital audio sources include a plurality of Internet radio sites, and the assigned entities include individual radio stations provided by those Internet radio sites.

Notably, the preset indicators 218 operate in the same manner, at least from the user's perspective, regardless of which entities are assigned and which of the digital audio sources provide the assigned entities. That is, each preset indicator 218 can provide for single press access to its assigned entity whether that entity is a user-defined playlist of digital music provided by an NAS device or an Internet radio station provided by an Internet music service.

With reference to FIG. 2C, the audio playback device 110 also includes a network interface 220, a processor 222, audio hardware 224, power supplies 226 for powering the various audio playback device components, and memory 228. Each of the processor 222, the graphical interface 212, the network interface 220, the processor 222, the audio hardware 224, the power supplies 226, and the memory 228 are interconnected using various buses, and several of the components may be mounted on a common motherboard or in other manners as appropriate.

The network interface 220 provides for communication between the audio playback device 110 and the controller (e.g., items 130a-c, FIG. 1), the server (item 140, FIG. 1), the audio sources (items 120, FIG. 1) and other audio playback devices 110 via one or more communications protocols. The network interface 220 may provide either or both of a wireless interface 230 and a wired interface 232. The wireless interface 230 allows the audio playback device 110 to communicate wirelessly with other devices in accordance with a communication protocol such as such as IEEE 802.11 b/g. The wired interface 232 provides network interface functions via a wired (e.g., Ethernet) connection.

In some cases, the network interface 220 may also include a network media processor 234 for supporting Apple AirPlay® (a proprietary protocol stack/suite developed by Apple Inc., with headquarters in Cupertino, Calif., that allows wireless streaming of audio, video, and photos, together with related metadata between devices). A suitable network media processor is the DM870 processor available from SMSC of Hauppauge, N.Y. The network media processor 234 provides network access (i.e., the Wi-Fi network and/or Ethernet connection can be provided through the network media processor 234) and AirPlay® audio. AirPlay® audio signals are passed to the processor 222, using the I²S protocol (an electrical serial bus interface standard used for connecting digital audio devices), for downstream processing and playback. Notably, the audio playback device 110 can support audio-streaming via AirPlay® and/or DLNA's UPnP protocols, and all integrated within one device. In some cases, one of the preset indicators 218 can be assigned an entity in which audio content is streamed via Apple AirPlay®, and another one of the preset indicators 218 on the same device can be assigned to an entity in which audio content is streamed via DLNA's UPnP protocols.

All other digital audio coming from network packets comes straight from the network media processor 234 through a USB bridge 236 to the processor 222 and runs into the decoders, DSP, and eventually is played back (rendered) via the electro-acoustic transducer(s) 215.

The network interface 210 can also include a Bluetooth low energy (BTLE) system-on-chip (SoC) 738 for Bluetooth low energy applications (e.g., for wireless communication with a Bluetooth enabled controller (item 130c, FIG. 1)). A suitable BTLE SoC is the CC2540 available from Texas Instruments, with headquarters in Dallas, Tex.

Streamed data pass from the network interface 220 to the processor 222. The processor 222 can execute instructions within the audio playback device (e.g., for performing, among other things, digital signal processing, decoding, and equalization functions), including instructions stored in the memory 228. The processor 222 may be implemented as a chipset of chips that include separate and multiple analog and digital processors. The processor 222 may provide, for example, for coordination of other components of the audio playback device 110, such as control of user interfaces, applications run by the audio playback device 110. A suitable processor is the DA921 available from Texas Instruments.

The processor 222 provides a processed digital audio signal to the audio hardware 224 which includes one or more digital-to-analog (D/A) converters for converting the digital audio signal to an analog audio signal. The audio hardware 224 also includes one or more amplifiers which provide amplified analog audio signals to the electroacoustic transducer(s) 215 for playback. In addition, the audio hardware 224 may include circuitry for processing analog input signals to provide digital audio signals for sharing with other devices in the acoustic system 100.

The memory 228 stores information within the audio playback device 110. In this regard, the memory 228 may store account information, such as the preset and recent information discussed above. The memory 228 may also provide storage for "tokens" for facilitating single press access to the digital audio sources 120 (e.g., the Internet radio services of FIG. 1). A token, as used herein, is a unique identifier that may be provided by the digital audio source 120 and which allows the digital audio source 120 to recognize the audio playback device 110 as being associated with a user's account with the digital audio source 120 and without requiring the user to enter credentials (e.g., user name, password, etc.) each time the audio playback device 110 attempts to access the digital audio source 120.

The memory 228 may include, for example, flash memory and/or non-volatile random access memory (NVRAM). In some implementations, instructions (e.g., software) are stored in an information carrier. The instructions, when executed by one or more processing devices (e.g., the processor 222), perform one or more processes. The instructions can also be stored by one or more storage devices, such as one or more computer- or machine-readable mediums (for example, the memory 228, or memory on the processor). The instructions may include instructions for performing decoding (i.e., the software modules include the audio codecs for decoding the digital audio streams), as well as digital signal processing and equalization.

The instructions may also include instructions for enabling certain "browsing" functionality. That is, at least in some cases, the controllers (items 130a-c, FIG. 1) serve as graphical remote controls for the audio playback devices 110 and do not communicate with the digital audio sources 120 (FIG. 1) directly, but, instead, communicate with the digital audio sources 120 via the audio playback devices 110.

Controllers

Figure 3:
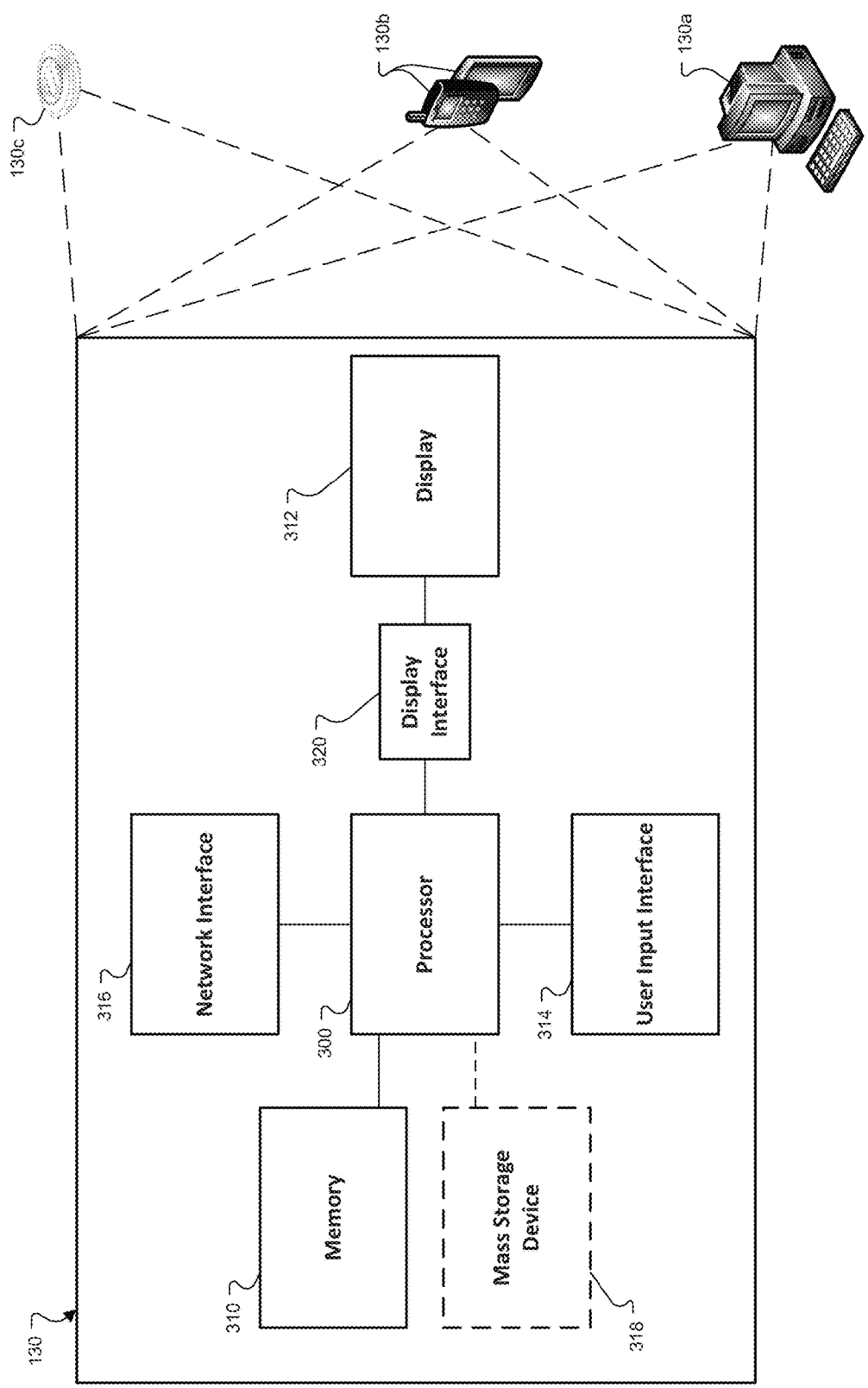
FIG. 3 is a block diagram of an exemplary controller from the audio system of FIG. 1.

Referring to FIG. 3, an exemplary controller 130 includes a processor 300, a memory 310, a display 312, a user input interface 314, and a network interface 316, among other components. The controller 130 may also be provided with a mass storage device 318, such as a hard drive, a microdrive, or other device, to provide additional storage. Each of the processor 300, the memory 310, the display 312, and the network interface 316 are interconnected using various buses, and several of the components may be mounted on a common motherboard or in other manners as appropriate.

The processor 300 can execute instructions (e.g., software) within the controller 130, including instructions stored in the memory 310 or in a secondary storage device (e.g., mass storage device 318). The processor 300 may be implemented as a chipset of chips that include separate and multiple analog and digital processors. The processor 300 may provide, for example, for coordination of other components of the controller 130, such as control of user interfaces, applications run by the controller 130, and network communication by the controller 130. The processor 300 may communication with a user through the display 312 and the user input interface 314.

The processor 300 may communicate with the user through a display interface 1020 coupled to the display 312. The display 312 may include an LCD monitor, or a touch sensitive display (e.g., in the case of a mobile device). The display interface 1020 may comprise appropriate circuitry for driving the display 312 to preset graphical and other information to the user.

The user input interface 314 may include one or more user input devices such as a keyboard, a pointer device such as a mouse, and/or a touch sensitive display. In some cases, the same device (e.g., a touch sensitive display) may be utilized to provide the functions of the display 312 and the user input interface 314.

The network interface 316 facilitates wireless communication (e.g., Wi-Fi, Bluetooth, IR, etc.) with one or more of the audio playback devices (item 110, FIG. 1) via a corresponding network interface (item 220, FIG. 2C) on the audio playback device 110.

The memory 310 stores information within the controller 130. In some implementations, the memory 310 is a volatile memory unit or units. In some implementations, the memory 310 is a non-volatile memory unit or units. The memory 310 may also be another form of computer-readable medium, such as magnetic or optical disk.

The mass storage device 318 is capable of providing mass storage for the controller 130. In some implementations, the mass storage device 318 may be or contain a computer readable medium, such as a floppy disk device, a hard disk device, an optical disk device, or a tape device, a flash memory or other similar solid state memory device, or an array of devices.

Instructions (e.g., software) can be stored in an information carrier. The instructions, when executed by one or more processing devices (e.g., the processor 300), perform one or more processes. The instructions can also be stored by one or more storage devices such as computer- or machine-readable mediums (for example, the memory 310, the storage device 318, or memory in the processor 300).

Alternatively, the preset assignment can be set or changed on the audio playback device itself by pressing and holding one of the preset indicators on the device's enclosure. This will assign an entity associated with currently plating content to the selected preset indicator.

Figure 4A:
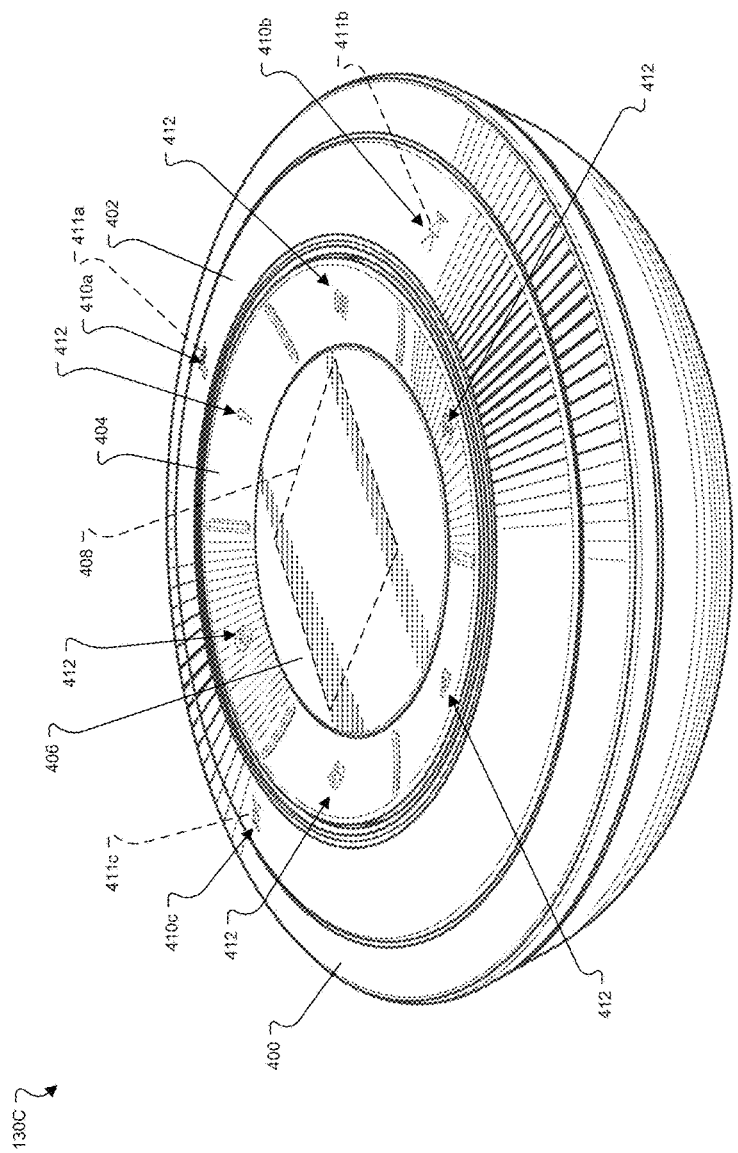
FIG. 4A is a perspective view a remote control device.

FIG. 4A illustrates an exemplary auxiliary controller 130c (as referred to as a "remote control device"). The remote control device 130c can enable the user to initiate a music experience from an associated one of the audio playback devices 110 (FIG. 1), e.g., via Bluetooth LE. Recents and presets that are saved on the associated audio playback device and/or associated with a user's system account are also available on the remote control device 130c. The remote control device 130c allows a user to browse and select recents and presets for providing content for rendering on the associated audio playback device.

The remote control device 130c includes a user interface having a plurality of concentrically arranged user interface elements. In the illustrated implementation, the user interface elements include a volume dial 400 (also referred to as the "volume ring"); a top cover 402; an inner ring 404; a center button 406; and a display 408.

The volume ring 400 can be activated by rotating the volume ring 400 (e.g., clockwise to increase volume and counterclockwise to reduce volume) to adjust the volume of the associated one of the audio playback devices. The top cover 402 includes a plurality of discrete buttons which, in the illustrated example, are implemented as capacitive touch buttons 410a, 410b, 410c (collectively referenced as 410) each with a backlit icon 411a, 411b, 411c (collectively referenced as 411). Alternatively or additionally, the discrete buttons can comprise one or more hardware buttons (e.g., displaceable buttons for actuating associated switches). In the illustrated example, the capacitive touch buttons 410 include a presets/recents modal button 410a, a skip forward button 410b, and a skip back button 410c.

When in presets mode, the inner ring 404 serves as the absolute location of a plurality of preset indicators 412 (six shown), which correspond to the preset indicators on the associated one of the audio playback devices. When in recents mode, a circular swiping motion along the inner ring 404 allows the user to browse the recents (e.g., a recents list provided by the associated audio playback device) via the display 408, and select a recent, for playback on the associated audio playback device, by pressing down on the inner ring 404.

The center button 406 includes a circular lens that masks the display 408. A central push on the center button 406 can power on or pause and unpause the associated audio playback device's audio. A press-and-hold on the center button 406 shuts down the associated audio playback device.

The display 408 can be a 1.6 inch diagonal OLED display and can be identical to the display 212 (FIG. 2A) on the associate audio playback device. The display 408 can show information related to presets, recents, current music playing ("Now Playing" music—music being rendered on the associated audio playback device) and system information. The display 408 can be configured to display substantially the same information as the associate audio playback device. This can help to provide a consistent appearance and user experience across the devices. In some cases, the information can be displayed concurrently on the remote control device and on the associated playback device.

Figure 4B:
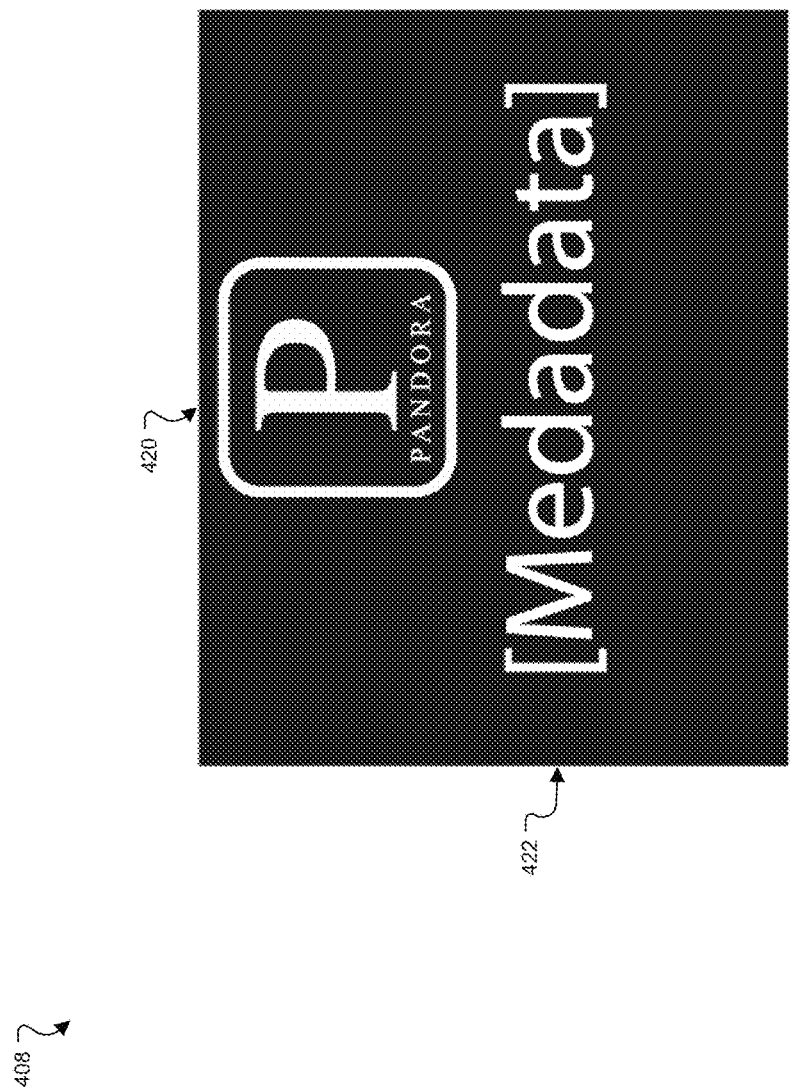
FIG. 4B is a screen shot from a display of the remote control device of FIG. 4A.

The remote control device 130c can also be configured to display information in substantially the same format as on the associated audio playback device. FIG. 4B illustrates an exemplary format for the display of current music playing. As shown in FIG. 4B, the display 408 may show information (e.g., an icon) 420 associated with an audio source (Pandora® in the illustrated example), along with metadata 422 associated with an entity associated with the audio source. For example, if the entity is an Internet radio station, then the displayed metadata may be the station name. If the entity is a user defined playlist, then the displayed metadata may be the playlist name. The entity may be an entity assigned to one of the presets, or an entity selected from the recents list for providing content for playback on the associated audio playback device.

Figure 5:
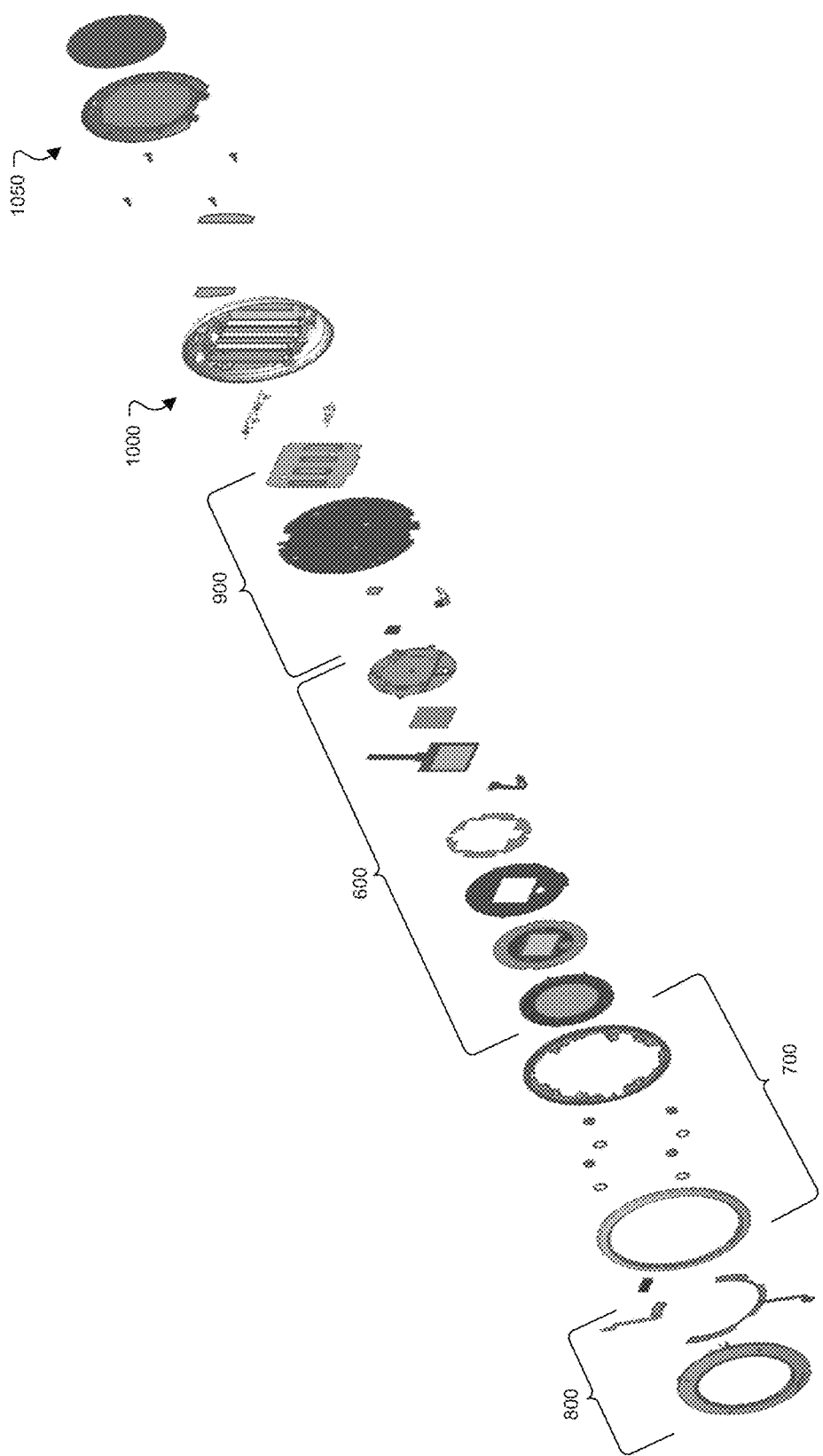
FIG. 5 is an exploded view of the remote control device of FIG. 4A.

Referring to FIG. 5, the remote control device 130c includes a nest assembly 600, a volume ring assembly 700, a top cover assembly 800, a main printed circuit board (PCB) assembly 900, a bottom enclosure 1000, and a battery door 1050.

Figure 6A:
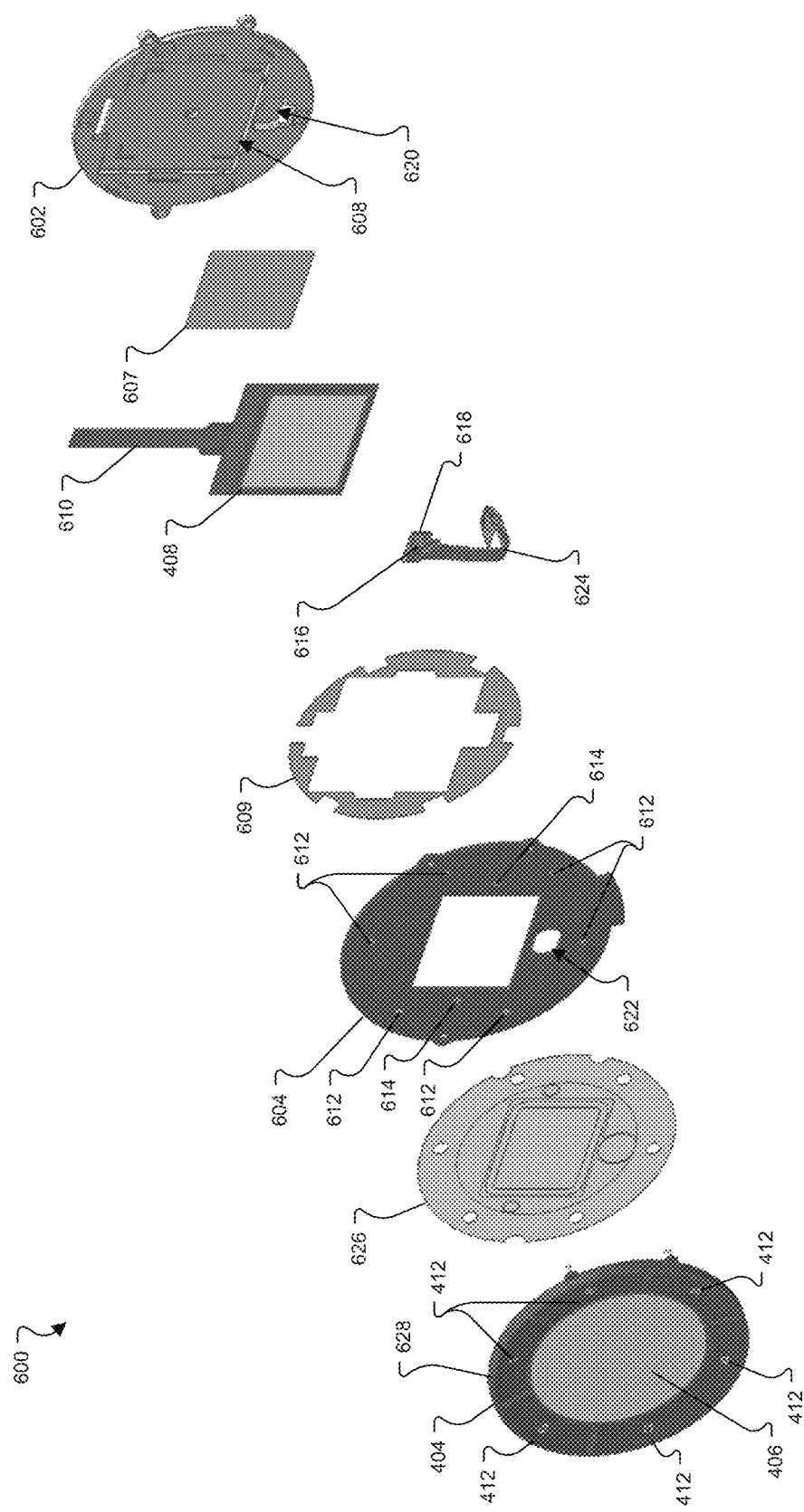
FIG. 6A is a first exploded view of a nest assembly from the remote control device of FIG. 5.
Figure 6B:
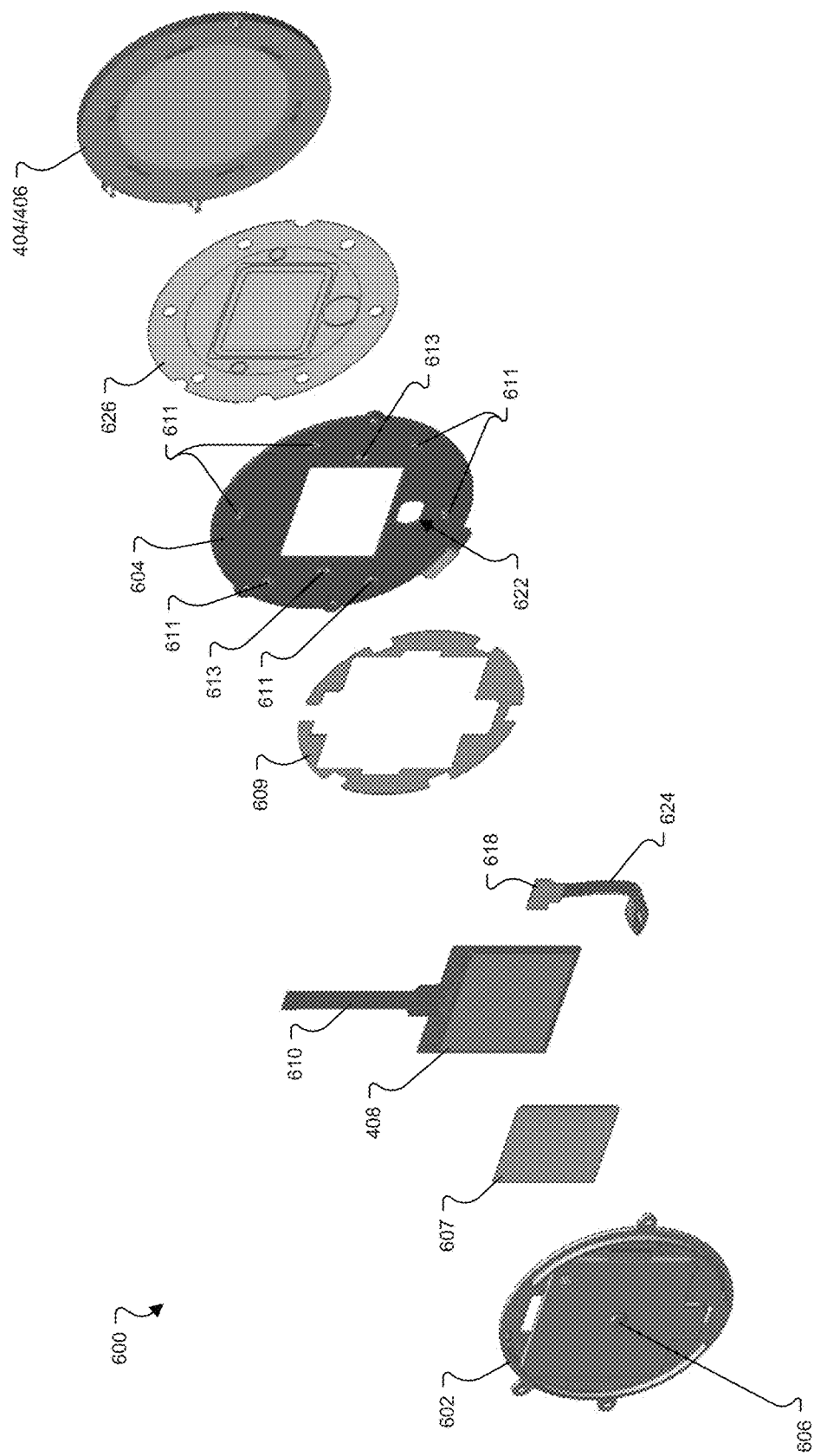
FIG. 6B is a second, opposite exploded view of the nest assembly of FIG. 6A.
Figure 7A:
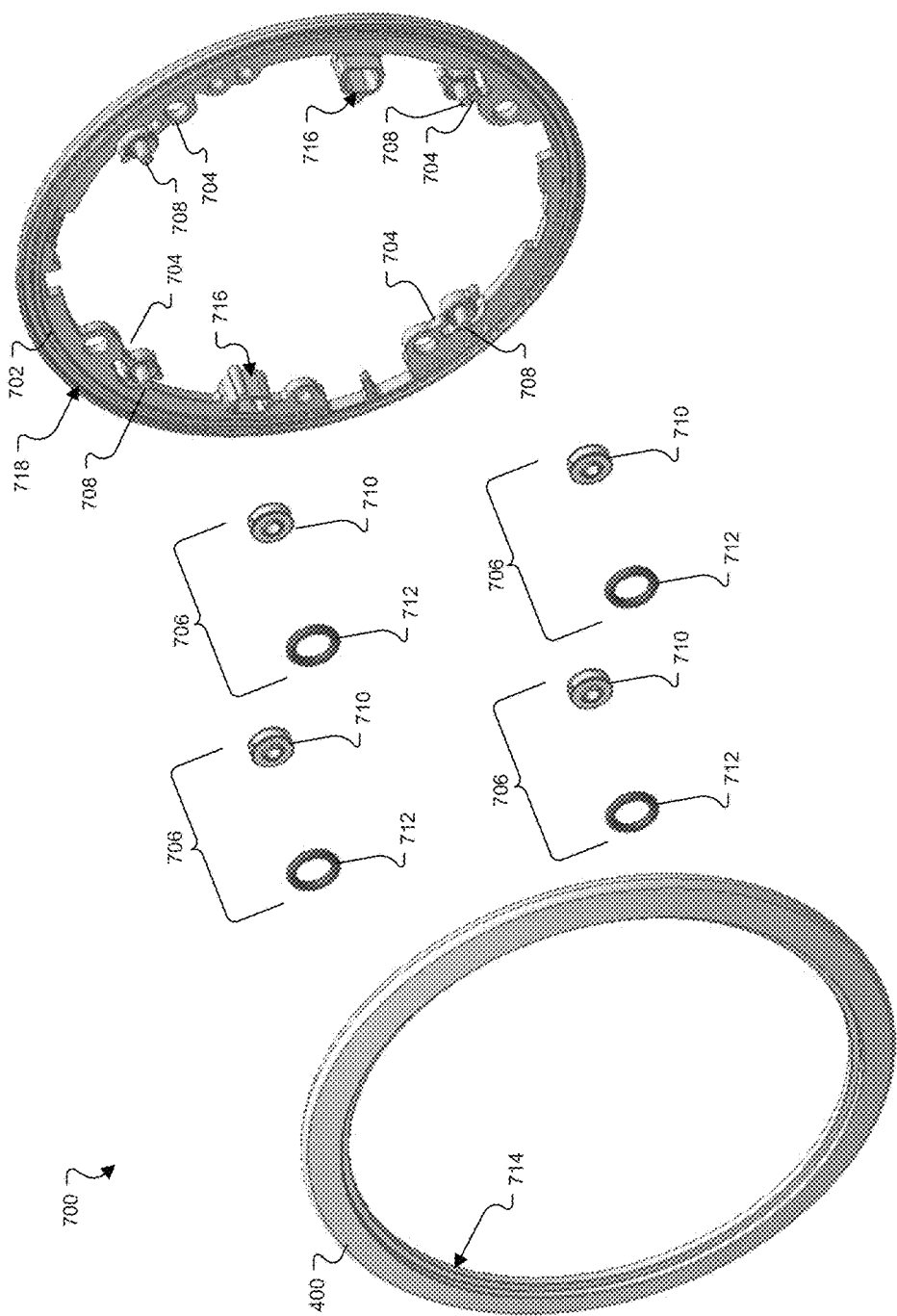
FIG. 7A is a first exploded view of a volume ring assembly from the remote control device of FIG. 5.
Figure 7B:
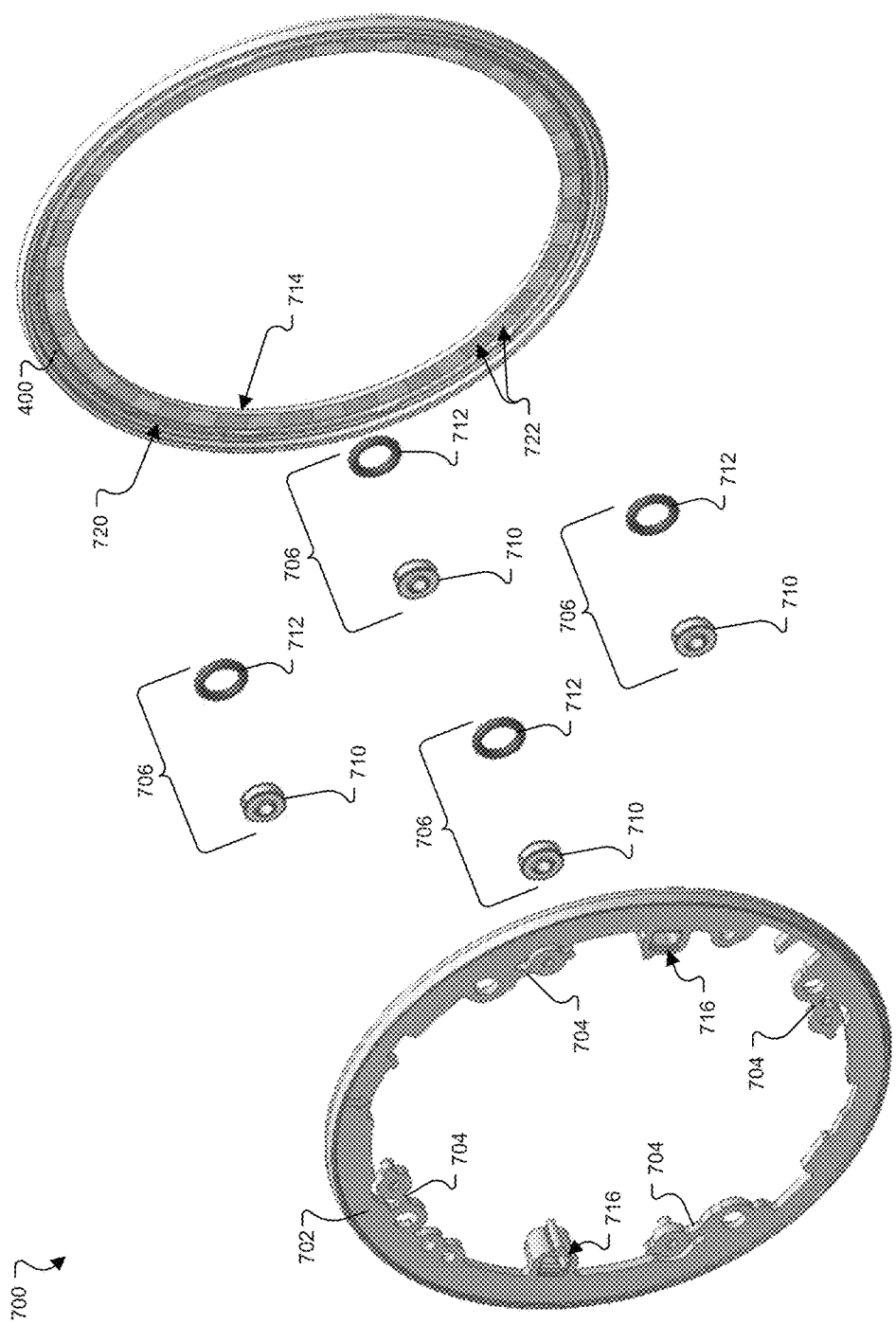
FIG. 7B is a second, opposite exploded view of the volume ring assembly of FIG. 7A.
Figure 7E:
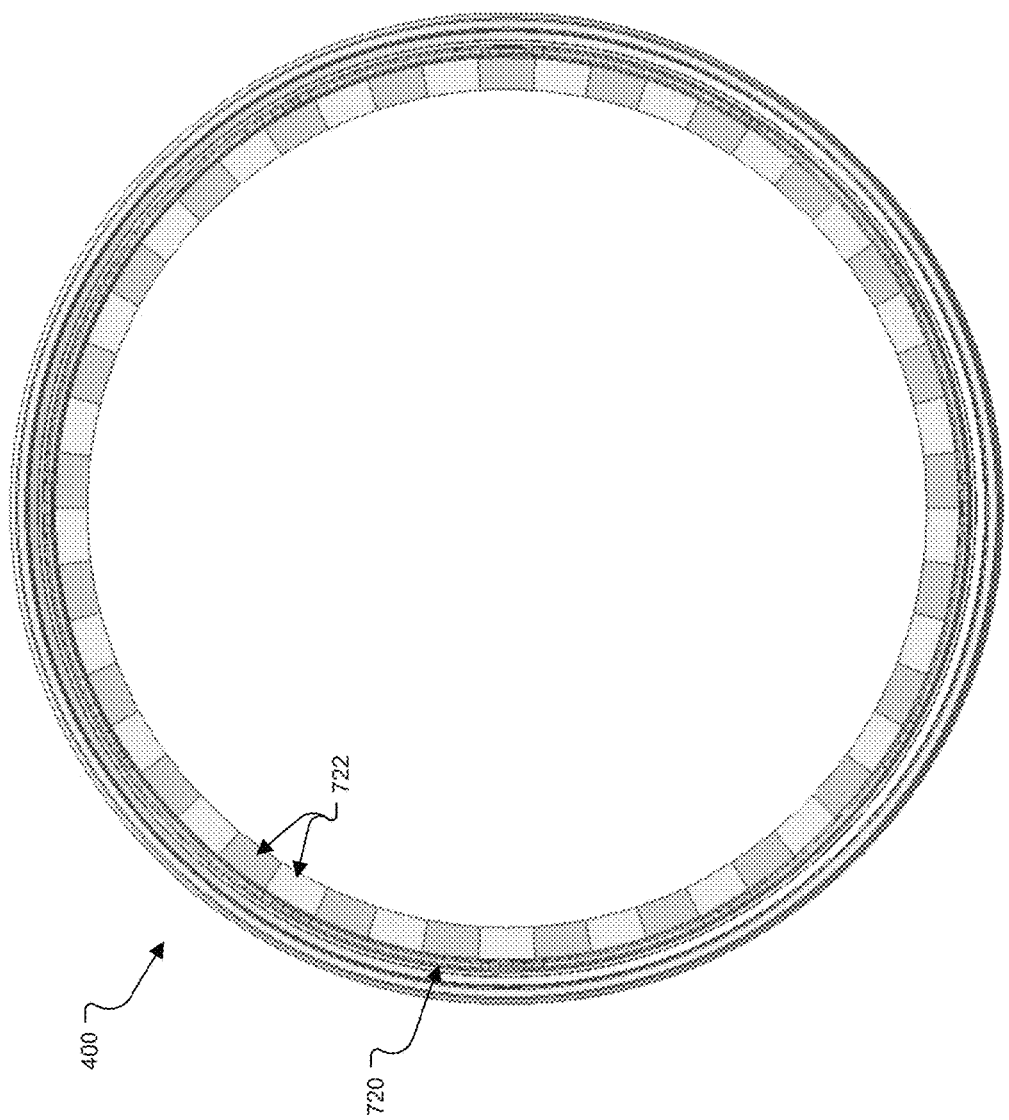
FIG. 7E is a bottom plan view of a volume ring from the volume ring assembly of FIG. 7A.

Referring to FIGS. 6A and 6B, the nest assembly 600 includes a nest 602, the display 408, a printed circuit board (also referred to as the capsense board 604), and the inner ring 404 and center button 406. Starting with the nest 602 which has a plunger 606 (FIG. 6B) that when pressed down activates a snap dome 907 (FIGS. 9A and 9B) (e.g., a metal snap dome switch) which resides on the main PCB assembly 900. When the remote control device 130c is fully assembled, the nest assembly 600 is disposed between the top cover 402 (FIG. 4A) and a top surface of the main PCB assembly 900.

The display 408 is adhered (e.g., with pressure sensitive adhesive 607) to the inside of a recess 608 of the nest 602, followed by the capsense board 604 which also gets adhered (e.g., with pressure sensitive adhesive 609) to the nest 602. The display 408 includes a cable 610 for electrical communication with the main PCB assembly 900, which controls the operation of the display 408. The capsense board 604 serves a number of functions. A plurality of light emitting diodes (LEDs) 611 (six shown) are provided around the outside of the capsense board 604 to light up six preset numbers on the preset indicators 412. The preset numbers may be dead front end such that they are only visible to the user when they are illuminated by the LEDs 611. The LEDs 611 are mounted on a back surface of the capsense board 604 and are arranged to align with openings 612 in the capsense board 604 to emit light in the direction of the preset indicators 412.

Infrared emitters 613 (a/k/a "LED emitters," "proximity emitters," or "emitters") for proximity sensing, as will be discussed below, are mounted on the capsense board 604 and may communicate with the main PCB assembly 900 via cabling (item 941, FIG. 9A) between the capsense board 604 and the main PCB assembly 900. In the illustrated example, the emitters 613 are mounted on a back surface of the capsense board 604 and are arranged to align with openings 614 in the capsense board 604 so as to emit an infrared signal upward, through the lens in the center button 406.

A proximity sensor 616 mounted on flexible printed circuitry 618 is positioned within a recess 620 within the nest 602 and is arranged to align with an opening 622 toward the middle of the capsense board 604 so as to emit an infrared signal upward, through the lens in the center button 406. The flexible printed circuitry 618 includes a cable 624 for electrical communication with the main PCB assembly 900, which controls the operation of the emitters 613.

The proximity sensor 616 looks through the lens in the center button 406 via the opening 622 in the capsense board 604. The emitters 613 in the nest assembly 600 fire upward (through openings 612 then through the lens in the center button 406 and away from the capsense board 604), and, when IR is reflected (e.g., off a user's hand reaching toward the remote control device 130c), the proximity sensor 616 picks that up. The emitters 613 and the proximity sensor 616 together provide a proximity detection circuit (a/k/a "proximity detector") for detecting the presence of a user's hand near the surface of the remote control device 130c. This can beneficially allow the remote control device to enter a low power (a/k/a "sleep") mode when it is not in use, which can help to limit power consumption.

For example, optical sensors (item 930, FIG. 9B) which are used for sensing rotation of the volume ring 400 may use a lot of power, and the display may also consume a lot of power, so it may be desirable to be able to turn those functions off when the user goes away. The proximity detector allows a low power state to be utilized. One or more functions may be deactivated in the low power state. For example, the optical sensors and the display may be deactivated while in the low power state. The remote control device 130a may be configured to enter the low power mode after a predetermined period (e.g., 5 seconds to 15 seconds) of non-use.

The proximity detector functions such that the remote control device 130c wakes up (i.e., enters a normal power state, e.g., in which the one or functions that were deactivated when entering the low power mode are re-activated) when a user goes to use it without actually having to touch the remote control device 130c; i.e., so that the user's first contact with the remote control device 130c can be used for content (e.g., music) selection. In that regard, the proximity detector can also help to facilitate "one touch" access to music. The idea here is that the user's actions wake the remote control device 130c up from a sleep or low power state before the user actually contacts the remote control device 130c so that the user can access content (e.g., music) with the user's first touch (e.g., by pressing one of the preset indicators 412, FIG. 4A).

First conductive traces around the capsense board 604 are Y-lines for a capacitive touch circuit and there are also additional traces on one or more internal conductive layers that are the X-lines for the capacitive touch circuit. The Y-lines are utilized to determine where a user's finger is radially and the X-lines are used to determine where the user's finger is angularly around the circle. The capacitive touch circuit provides an infinite position sensor, allowing a user's finger to be sensed and located at any position along the circular path of the capacitive touch circuit. When assembled, the capacitive touch circuit is positioned beneath the inner ring 404 and is utilized for sensing a position of a user's finger on the inner ring 404.

Next is the inner ring 404 and center button 406 which, in the illustrated example, is a one piece molded part. The inner ring 404 has in-mold labeling (IML) in it. The IML is a printed substrate on a clear piece of acrylic plastic. Various layers of ink, e.g., including white diffuser ink and layers of black light-blocking ink, are printed on a sheet to achieve the icons (the preset numbers).

In one example, a top surface of the inner ring 404 is matte while the lens in the center button 406 is clear and glossy. This can be achieved by printing matte ink on the top surface of the inner ring 404 and then the sheen of the clear lens just matches the raw substrate itself. This allows two different surface finishes on the same part. The substrate can be printed in the flat and then formed (shaped) in a tool, and, then, plastic can be molded in behind it to provide a one piece plastic part. The inner ring 404 and center button 406 part is adhered to the top surface of the capsense board 604 to complete the nest assembly 600. In this regard, a label (substrate 626) carrying adhesive is provided for adhering the inner ring 404 and center button 406 to the top surface of the capsense board 604. The substrate 626 can include regions of light blocking ink for masking portions (e.g., edges) of the display 408. The substrate 626 can also include regions of IR transparent ink to provide isolated windows that permit passage of infrared waves for the emitters 613 and the sensor 616.

Figure 9B:
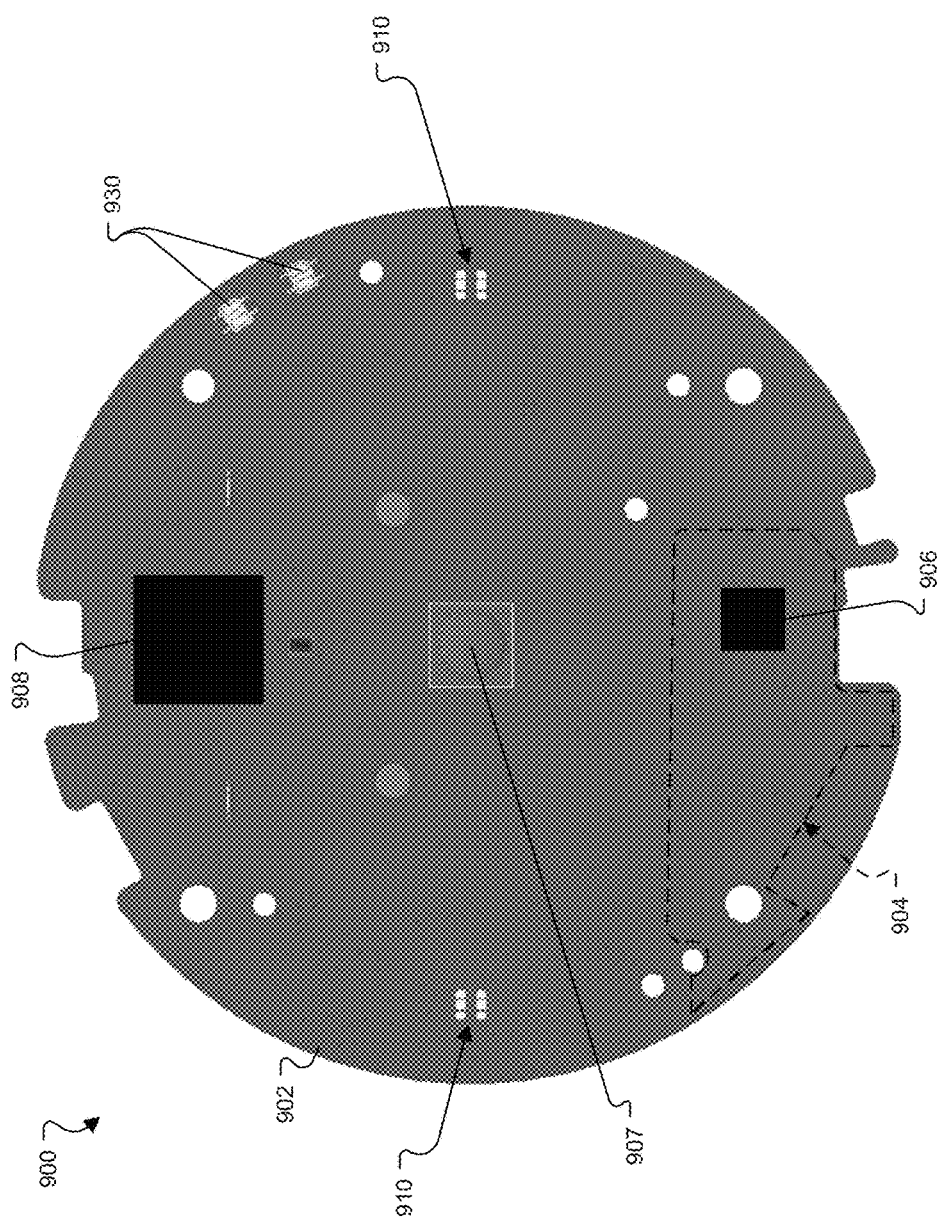
FIG. 9B is a top plan view of the printed circuit board assembly of FIG. 9A.

The nest assembly 600 mates to the top cover 402 where, when assembled, a lip 628 around the perimeter of the inner ring 404 mates with a recess in the inner diameter of the top cover 402 such that when a user presses one of the presets indicators 412 on the inner ring 404 it is using the opposite side as a pivot point, and, in the middle, the nest 602 is moving down and activating the snap dome 907 (FIG. 9B). Consequently, when the user presses one of the preset indicators 412, the nest assembly 600 pivots about a point 180 degrees opposite the press and the downward motion of the nest assembly 600 actuates the snap dome (item 907, FIG. 9B). The nest assembly 600 is configured so that there is enough travel at the preset indicators 412 such that the snap dome 907 (FIGS. 9A and 9B) is always being snapped over when one of the preset indicators 412 is pressed, and, such that, from a user's perspective, there is not a huge difference between the feel of hitting the center of the center button 406 or the preset indicators 412 along the edges.

When the user presses down on the inner ring 404, the remote control device 130c will receive input from the capsense board 604 indicating the relative position of the user's finger on the inner ring 404 (e.g., which can be used to determine which one of the preset indicators 412 the user is pressing) in combination with input indicating the actuation of the snap dome 907. The remote control device 130c is configured to interpret actuation of the snap dome 907 in combination with input from the capsense board 604 indicating a position of a user's finger on the inner ring as selection of a preset, if the device is operating in the presets mode; or as selection of a recent, if the device is operating in the recents mode.

A central press on the center button 406 will also actuate the snap dome 907. The nest assembly 600 is configured such that, from the user's perspective, there is not a significant difference, in terms of tactile feedback, between the feel of pressing the center or the preset indicators 412 at the edges. The remote control device 130c is configured to interpret actuation of the snap dome 907, in the absence of input from the capsense board 604 indicating a position of a user's finger on the inner ring, as selection of a function associated with the center button 406.

Referring to FIGS. 7A through 7E, the volume ring assembly 700 includes the volume ring 400 and a support ring 702 for supporting the volume ring 400. The support ring 702 includes a plurality of biasing elements in the form of spring arms 704, and a plurality of rotatable engagement members 706 disposed on the spring arms 704 and configured to engage the volume ring 400 so as to preload the spring arms 704 and thereby bias the volume ring 400 toward a center position, in which the axis of rotation (i.e., the central axis) of the volume ring 400 is coincident with the central axis of the support ring 702, and increasing resistance to (damping) rotational movement of the volume ring 400.

The spring arms 704 can be formed integrally with the support ring 702. For example, in some cases, the spring arms 704 and the support ring 702 can be made out of plastic and integrally formed in a molding process. Each of the spring arms 704 includes an axle 708 (which may be integrally formed with the respective spring arm 704) for supporting an associated one of the engagement members 706 such that the engagement members 706 are rotatable relative to the spring arms 704. In this example, the engagement members 706 each include a wheel 710 and a compliant member 712 (e.g., elastomer O-rings) disposed about an outer diameter of the wheel 710. When assembled, the compliant members 712 rest against a smooth cylindrical contact surface 714 along the inner diameter of the volume ring 400. The contact between the engagement members 706 and the volume ring 400 preloads the spring arms 704 thereby centering the volume ring 400.

From a user's perspective, the spring arms 704 and engagement members 706 help to control the position of the volume ring 400. The volume ring 400 can still be pushed off center because the spring arms 704 deflect, but the spring arms 704 will re-center it. The combination of the spring arm stiffness and the durometer of the compliant members can be selected to control the rotational resistance, which can provide a tactile benefit such as a perception of quality resulting from a smooth feel. Allowing the engagement members 706 to contact a smooth annular surface of the volume ring 400 can help to provide for stepless (i.e., non-indexed) rotation of the volume ring 400. It also allows the volume ring 400 to be infinitely positionable for a smoother feel, rather than clicking through a plurality of indexed locations.

The support ring 702 also includes light guides 716 (a/k/a "shrouds") for directing light from LEDs (910, FIG. 9A) on the main PCB to icons on the top cover 402 (FIG. 4A). The light guides 716 contain the light to prevent the light from bleeding into different parts of the remote control device 130c. The support ring 702 also includes a grease trough 718 with grease in it. An annular rib 720 on the volume ring 400 rides in the grease trough 718. The grease can provide some additional damping and can help to cut down on noise.

The volume ring 400 includes an encoded pattern 722 on a back surface. In the illustrated example, the encoded pattern 722 is a checkered graphic, which may be painted on or formed in a two-shot molding process using plastic of different colors (e.g., black and white). Optical sensors (items 930, FIG. 9B) on the main PCB assembly 900 (FIG. 9B) read the encoded pattern 722 to detect rotation of the volume ring 400.

Figure 8A:
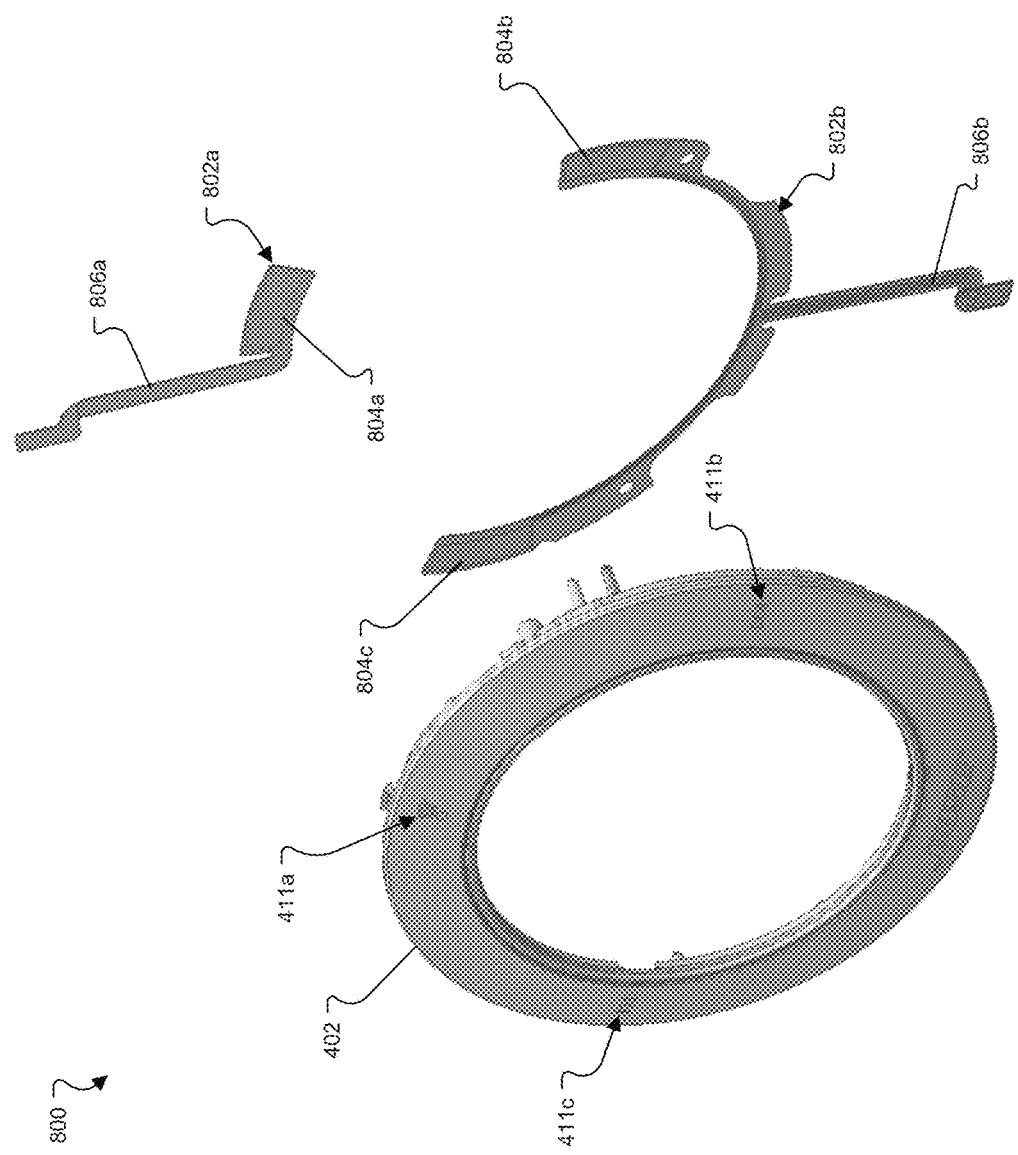
FIG. 8A is a first exploded view of a middle ring assembly from the remote control device of FIG. 5.
Figure 8B:
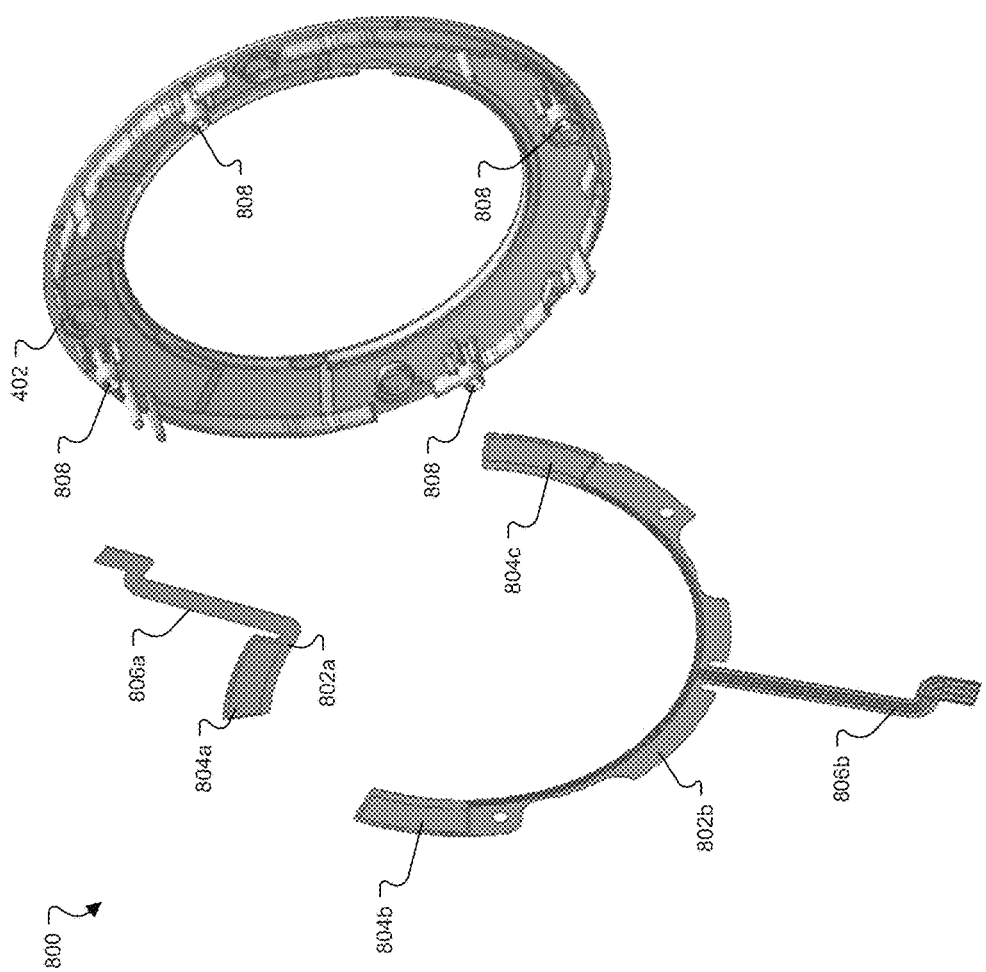
FIG. 8B is a second, opposite exploded view of the middle ring assembly of FIG. 8A.

Referring to FIGS. 8A and 8B, the top cover assembly 800 (a/k/a "middle ring") includes the top cover 402 and a pair of capacitive touch circuits 802a, 802b. The capacitive touch circuits 802a, 802b define a plurality of discrete capacitive touch regions 804a, 804b, 804c for providing the transport functions and modal button. The capacitive touch regions 804a, 804b, 804c align with the icons 411a, 411b, 411c, respectively, on the top cover 402 to form the capacitive touch buttons 410a-c (FIG. 4). Each of the capacitive touch circuits 802a, 802b includes an integrated cable 806a, 806b for establishing an electrical communication with the main PCB assembly 900. The capacitive touch circuits 802a, 802b may be formed as flexible printed circuits which can be adhered to a back surface of the top cover 402 with a pressure sensitive adhesive.

Figure 9C:
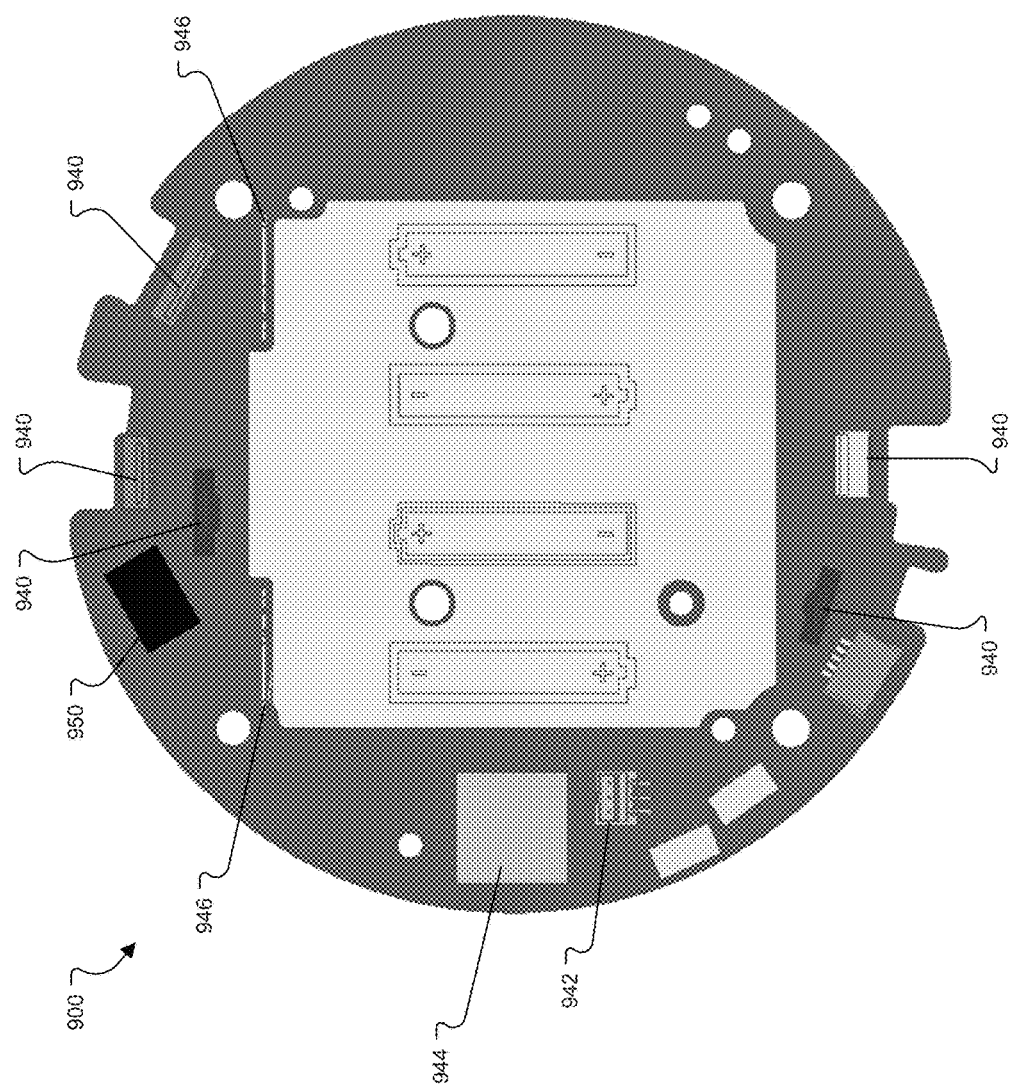
FIG. 9C is a bottom plan view of the printed circuit board assembly of FIG. 9A.

Referring to FIGS. 9A through 9C, the main PCB assembly 900 includes a printed circuit board (PCB) 902 including a network interface 904 for communication with an associated one of the audio playback devices. In one example, the network interface 904 includes a radio chip 906 (e.g., a Bluetooth chip) and all the circuitry that controls it. The main PCB assembly 900 also includes the snap dome switch 907 (a/k/a "snap dome" or "dome switch"), and a main processor 908 which is mounted on the PCB and which controls all of the capacitive touch circuitry on the nest and top cover assemblies 600, 800, the LEDs, etc. A gasket 909 is provided to cover the snap dome 907.

As mentioned above, the main PCB assembly 900 also includes a pair of optical sensors 930 for reading the movement of the volume ring 400. Referring to FIG. 9C, on the opposite side of the main PCB assembly 900 there are connectors 940 for mating cables 610 (FIG. 6A), 624 (FIG. 6A), 806a, 806b (FIG. 8A), and 941 (FIG. 9A) which provide electronic communication between the main PCB assembly 900 and the display 408, the flexible printed circuitry 618, the capacitive touch circuits 802a, 802b, and the capsense board 604, respectively. There is also another connector 942 that is accessible from the outside of the remote control device 130c that allows software to be re-flashed (e.g., during manufacturing). Updates to the software can also take place though the associated one of the audio playback devices after build.

There is also a piezoelectric transducer 944 which can be utilized to provide for tactile and/or audible feedback. For example, the piezoelectric transducer 944 may be utilized with the modal buttons (410a-c, FIG. 4A) such that when a user clicks those capacitive buttons, which do not move, some sort of feedback (e.g., audible feedback) is provided. Battery contacts 946 are also provided for providing electrical connections to batteries for powering the remote control device 130c. The PCB assembly 900 also includes a memory 950 (e.g., non-volatile memory, e.g., flash memory) which can be utilized for storing preset and/or recents information and/or one or more computer programs to be executed by the main processor 908.

The bottom enclosure 1000 has a battery compartment 1010 with jumps 1012 (electrical contacts) for the batteries. The back surface of the main PCB assembly 900 rests against the bottom enclosure 1010 so that the battery contacts 946 extends into the battery compartment 1010 for completing the electrical connection between the batteries 1013 and the main PCB assembly 900. Screws 1014 are driven through holes in the bottom enclosure 1000, the main PCB assembly 900, and the volume ring assembly 700 and are secured into posts 808 (FIG. 8B) in the top cover 402, thereby securing the top cover assembly 800, the volume ring assembly 700, the main PCB assembly 900, and the bottom enclosure 1000 together.

Figure 10A:
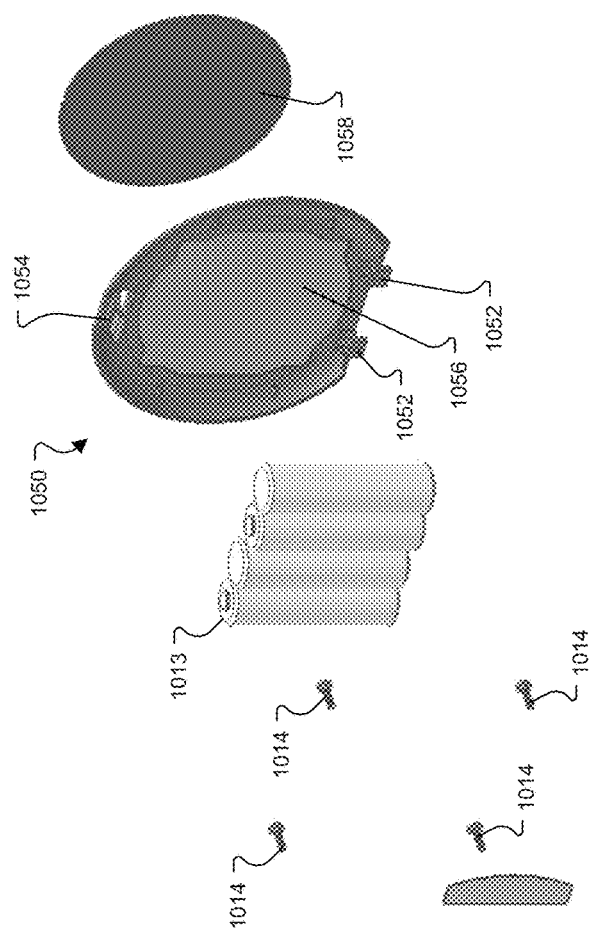
FIG. 10A is a first exploded view showing a back cover and battery door of the remote control device of FIG. 5.
Figure 10A:
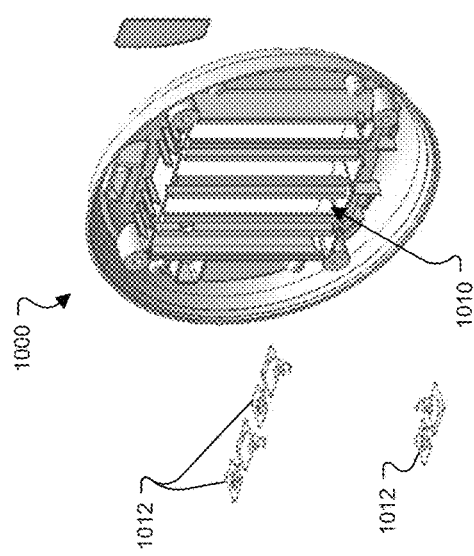
Figure 10B:
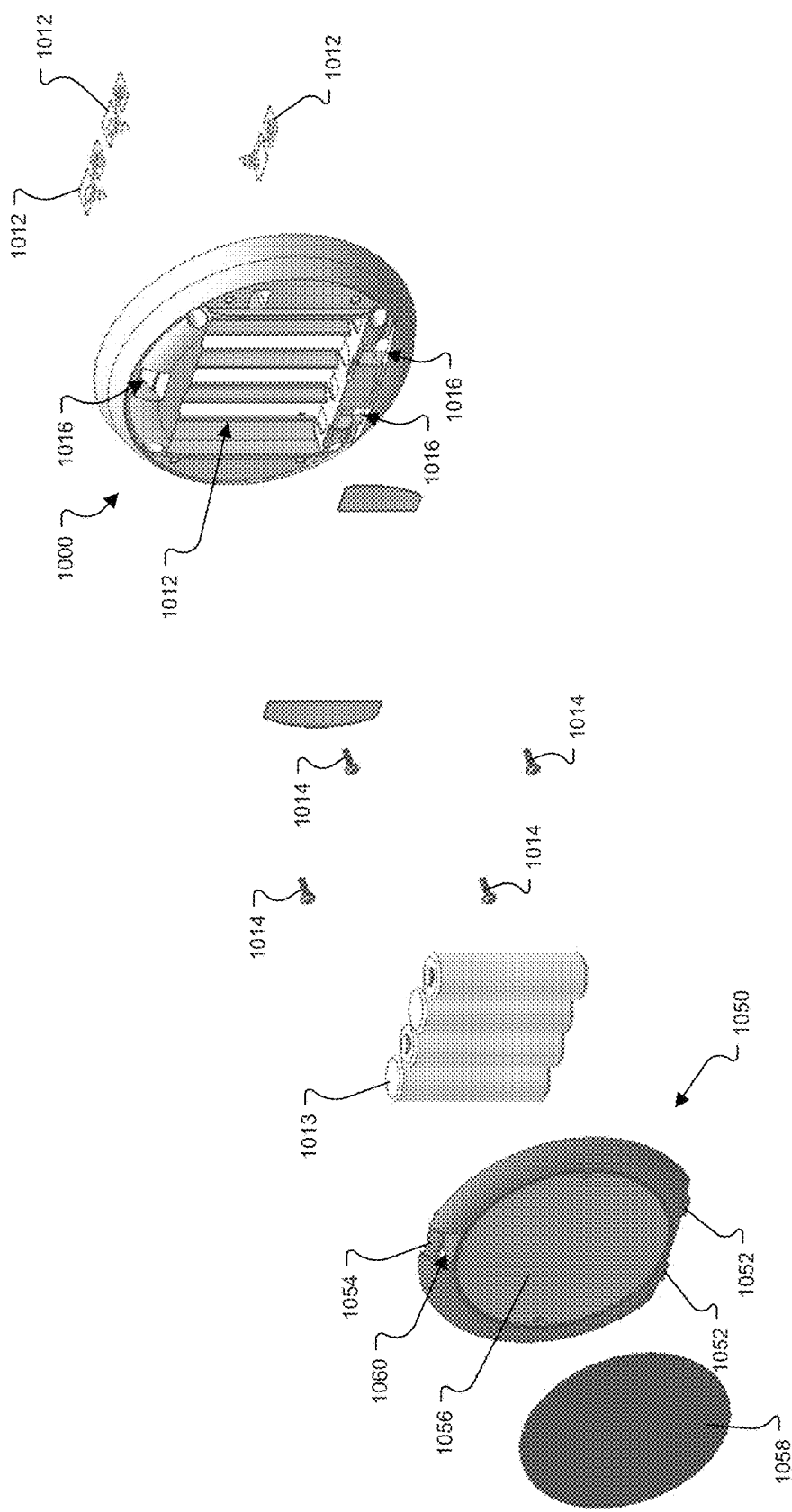
FIG. 10B is a second, opposite exploded view showing the back cover and battery door of the remote control device of FIG. 5.

Referring to FIGS. 10A and 10B, the bottom enclosure 1000 also includes openings 1016 for the battery door 1050 to engage with. In that regard, the battery door 1050 includes a pair of feet 1052 and a spring tab 1054 which engage corresponding ones of the openings 1016 in the bottom enclosure 1000 for securing the battery door 1050 thereto. The battery door 1050 can be formed of molded plastic and includes a piece of steel 1056 which is insert molded. A silicone pad 1058 is adhered to a back surface of the battery door 1050 which can help to provide a soft landing surface and which can help to prevent the remote control 130c from sliding when placed on a smooth surface (such as a countertop).

Figure 11A:
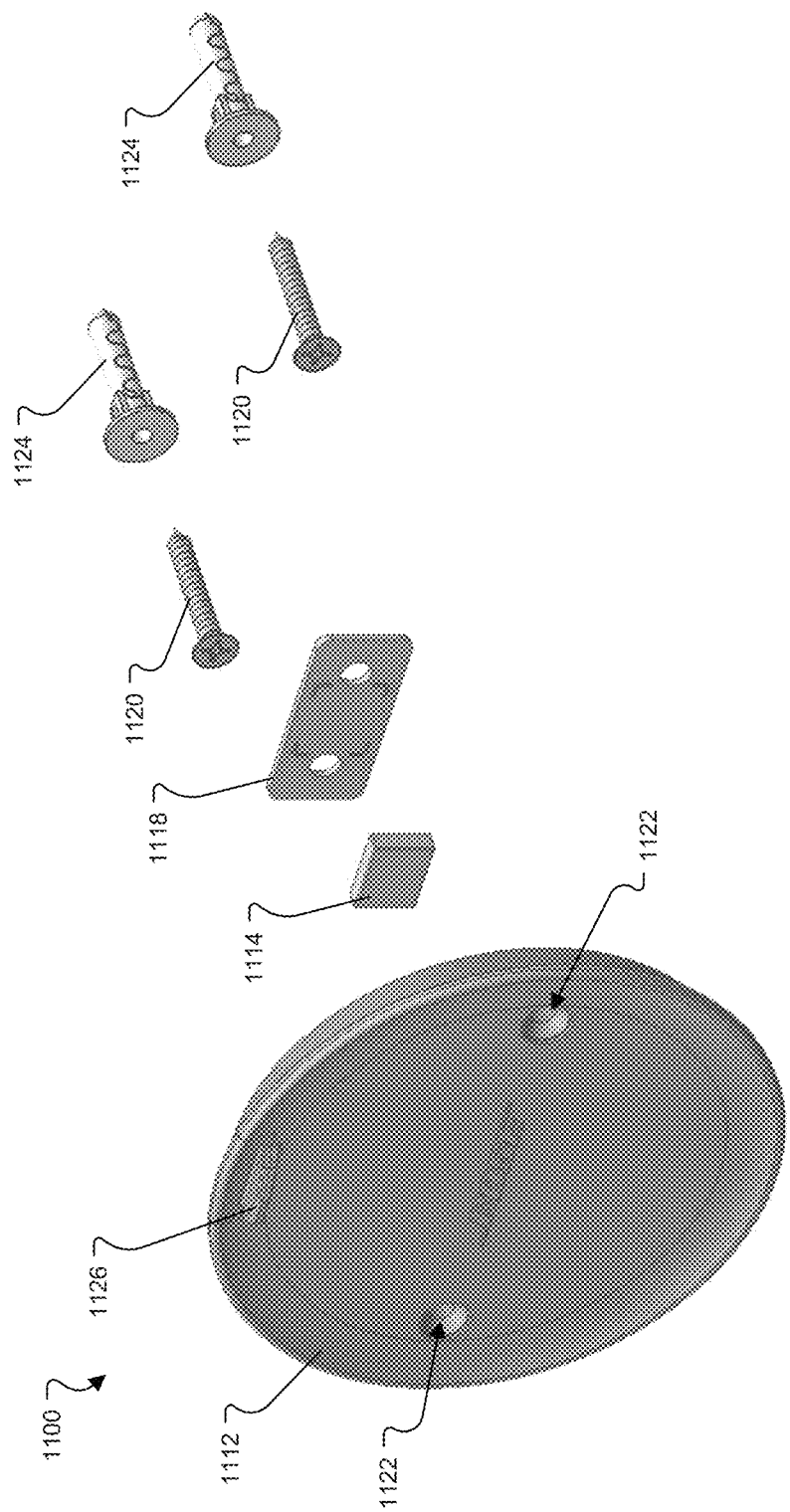
FIG. 11A is a first perspective view of a mount and associated mounting hardware for the remote control device of FIG. 5.
Figure 11B:
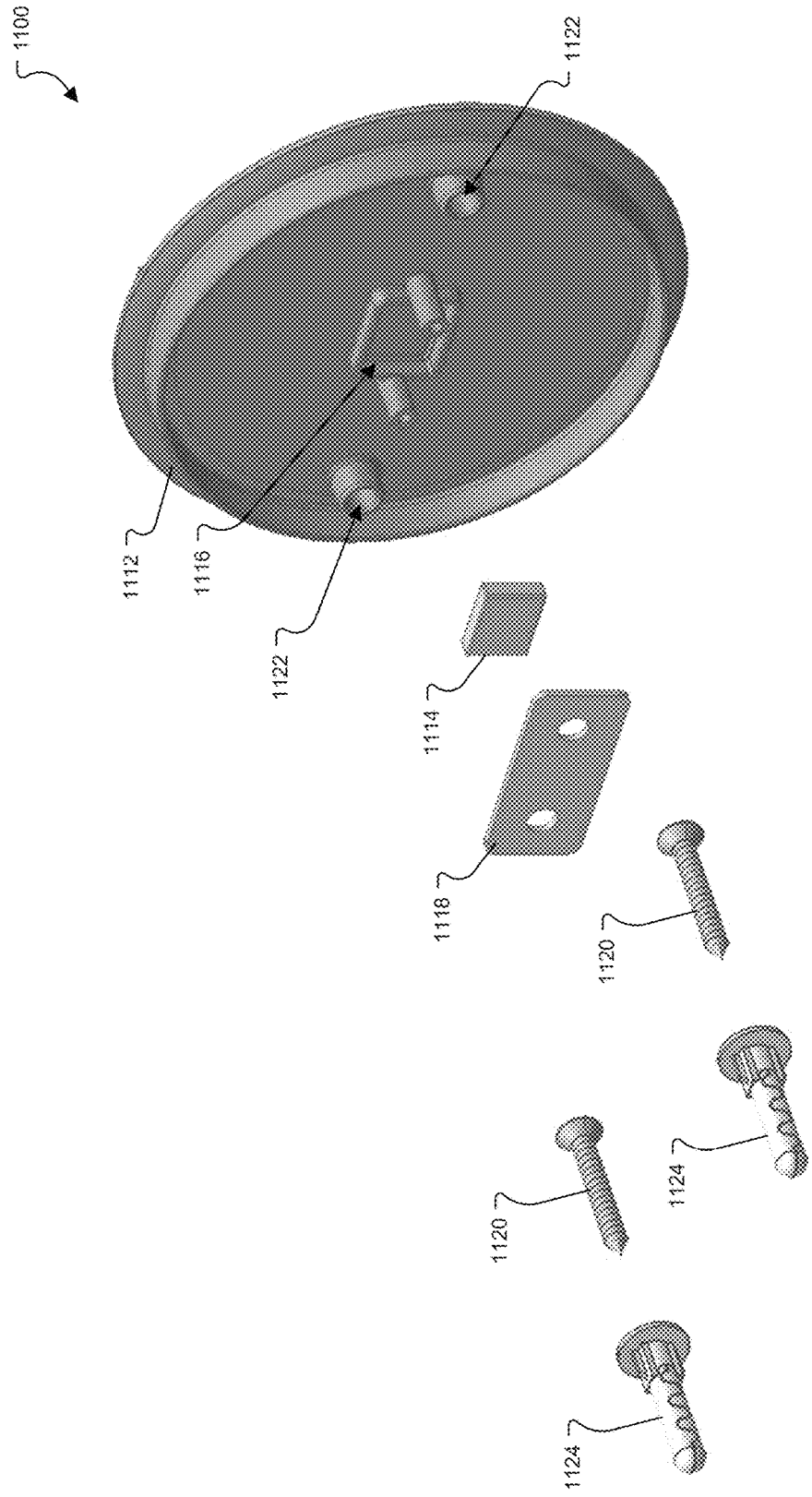
FIG. 11B is a second, opposite perspective view of the mount and associated mounting hardware from FIG. 11A.

Referring to FIGS. 11A and 11B, a mount 1100 may be provided for mounting the remote control device 130c to a surface, such as a wall. The mount 1100 includes a bracket 1112 and a magnet 1114. The magnet 1114 is secured in a recess 1116 (FIG. 11B) along a back surface of the bracket 1112 via a retaining plate 1118. Screws 1120 pass through holes 1122 in the bracket 1112 and are secured into anchors 1124 (e.g., in a wall). The steel 1056 (FIGS. 10A and 10B) in the battery door is attracted to the magnet 1114 in the mount 1100 to hold the remote control device 130c on the mount 1100. A tab 1126 on the mount 1100, which engages a notch 1060 (FIG. 10B) formed by the spring tab 1054 in the battery door 1050, is used for orientation so that the remote control device 130c is attached to the mount 1100 (e.g., on a wall) in the correct orientation.

Figure 12:
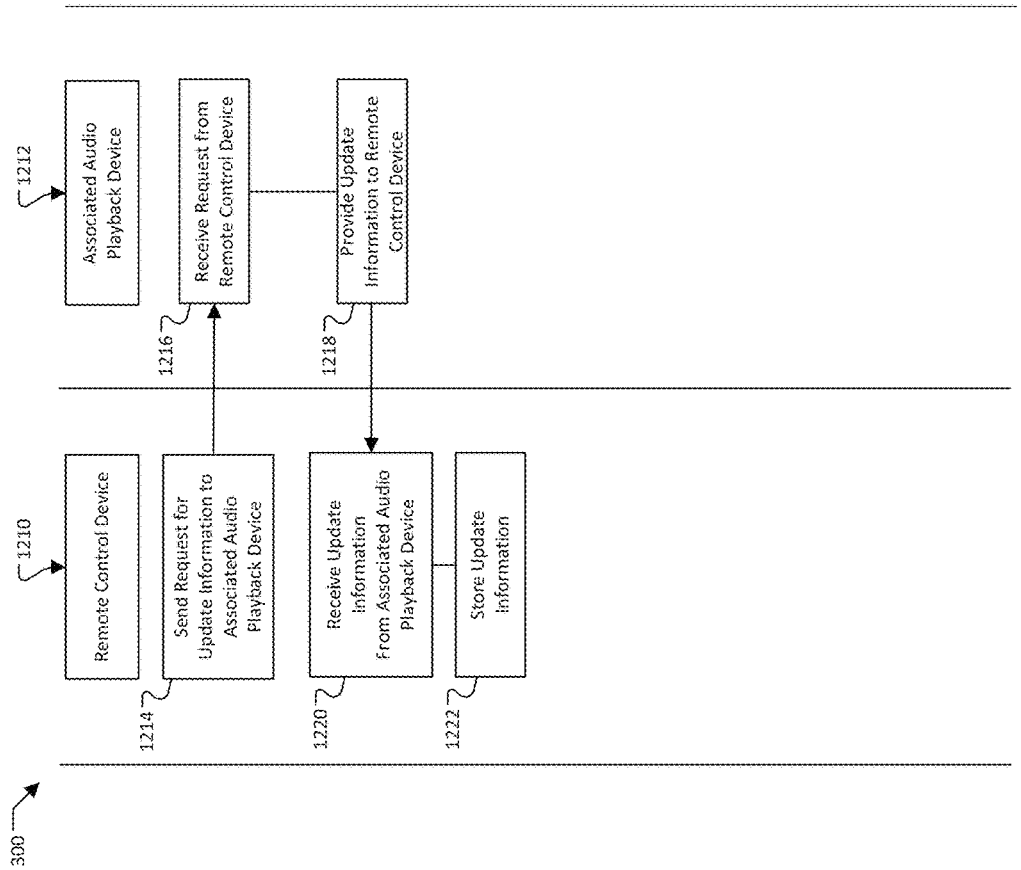
FIG. 12 is a swim lane diagram showing steps for managing preset assignments and a recents list on the remote control device of FIG. 5.

FIG. 12 is a swim lane diagram showing steps for managing preset assignments and recents list on the remote control device 130c. "Swim lane" diagrams may be used to show the relationship between the various "actors" in the processes and to define the steps involved in the processes. FIG. 12 (and all other swim lane Figures) may equally represent a high-level block diagram of components of the invention implementing the steps thereof. The steps of FIG. 12 (and all the other FIGS. employing swim lane diagrams) may be implemented on computer program code in combination with the appropriate hardware. This computer program code may be stored on storage media such as a diskette, hard disk, CD-ROM, DVD-ROM or tape, as well as a memory storage device or collection of memory storage devices such as read-only memory (ROM) or random access memory (RAM). Additionally, the computer program code can be transferred to a workstation over the Internet or some other type of network.

Two swim lanes are shown in FIG. 12 including a lane for a selected one of the controllers 1210, a lane for an associated one of the audio playback devices 1212. At step 1214, the remote control device 130c requests update information corresponding to preset assignments and/or a recents list from the associated audio playback device. At step 1216, the associated one of the audio playback devices receives the request. The associated audio playback device responds by providing preset and/or recents information (which may consist of an updated recents list and/or an updated set of preset assignments) to the remote control device (1218). This information may be obtained from memory on the associated audio playback device.

The remote control device 130c receives the preset assignments and/or recents information from the associated audio playback device (1220). At step 1222, the remote control device 130c stores the preset assignments and/or recents information within local memory (e.g., memory 950 (FIG. 9B) or memory internal to the main processor 908 (FIG. 9A)) on the remote control device 130c. Old information will be discarded/overwritten as updated information (e.g., update preset assignments and/or updated recents) becomes available. Following these steps, the remote control device 130c and the associated audio playback device will have the same preset assignments and/or recents list. In some cases, the remote control device 130c is configured to poll the associated audio playback device each time it is turned on or woken up from a sleep (a/k/a "low power") state. Additional details regarding the updating of the remote control device may be found in U.S. patent application Ser. No. 14/023,075, filed concurrently herewith, entitled "Remote Control Devices and Related Devices and Systems", with attorney docket number: H-13-133-US, inventors: Jonathan Christopher Sevigny et al., the entire contents of which are hereby incorporated by reference.

Other Implementations

While an implementations of an auxiliary controller have been described in which rotatable engagement members engage a smooth cylindrical contact surface of a volume ring so as to provide a smooth, non-indexed rotation, other implementations are possible. For example, in another implementation, the volume ring includes a plurality of detents arranged along the contact surface of the volume ring for the engagement members to rest in such that the volume ring is rotatable between a plurality of discrete positions as defined by the detents. As the volume ring is rotated, the engagement members will roll along the contact surface into and out of engagement with the detents. During rotation, the spring arms will be compressed inwards as the regions of the contact surface between the detents pass along the engagement members. When the volume ring is rotated to a position in which the detents align with the engagement members, the spring arms will displace the engagement members outwardly into engagement with the detents to hold the volume ring in one of the discrete positions. The engagement of the engagement members with the detents can also provide the user with a tactile feedback (i.e., as the engagement members snap are displaced into contact with the detents).

In another implementation, the rotatable engagement members can include a plurality of teeth arranged along the surfaces which engage the volume ring. The volume ring can include a plurality of mating teeth which the teeth on the engagement members engage with in a planetary gear type configuration.

While implementations have been described in which a support ring of a volume ring assembly includes biasing elements in the form of spring arms, in some cases, one or more of the biasing elements could alternatively take the form of leaf springs.

Implementations of the systems and methods described above comprise computer components and computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. In addition, the instructions may be implemented in a high-level procedural and/or object-oriented programming language, and/or in assembly/machine language. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

In some implementations, the IR direct reflecting proximity sensor can be replaced with accelerometers, or capacitive sensors.

In certain implementations, piezoelectric pads can be used to provide tactile (rather than audible) feedback as a user swipes his/her finger around the inner ring. In some examples, those same piezoelectric pads may be used to sense a button press as well, instead of the snap dome.

Figure 13A:
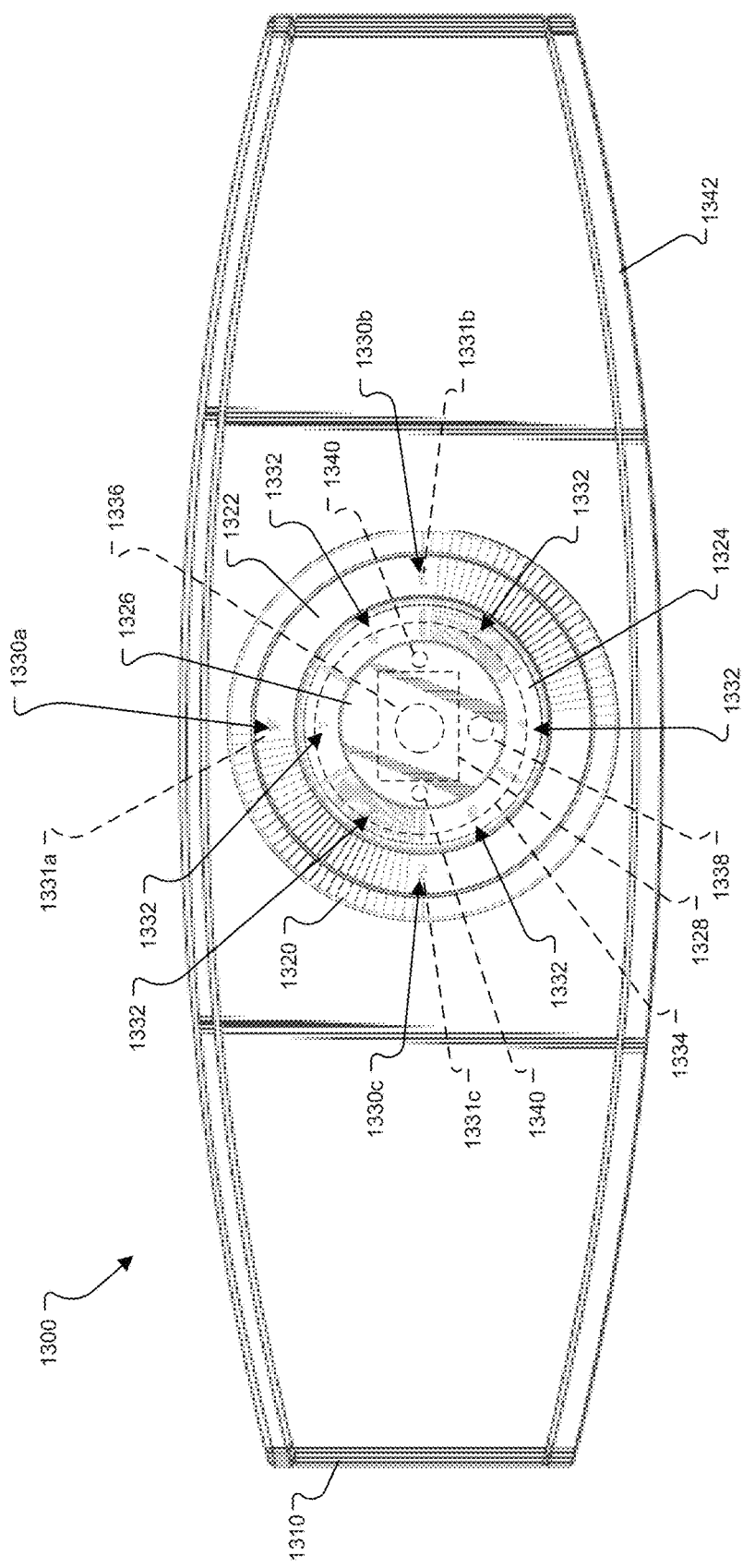

In some implementations, a user interface similar to the one illustrated in FIG. 4A can be incorporated into one of the audio playback devices. For example, FIG. 13 illustrates an audio playback device 1300 that includes an enclosure 1310 and on the enclosure 1310 there resides a user interface that includes a plurality of concentrically arranged user interface elements. In the illustrated implementation, the user interface elements include a volume dial 1320 (a/k/a volume ring); a top cover 1322; an inner ring 1324; a center button 1326; and a display 1328.

The volume ring 1320 can be activated by rotating the volume ring 1320 (e.g., clockwise to increase volume and counterclockwise to reduce volume) to adjust the volume of the audio playback device 1300. The top cover 1322 includes a plurality of discrete buttons which, in the illustrated example, are implemented as capacitive touch buttons 1330a, 1330b, 1330c (collectively referenced as 1330) each with a backlit icon 1331a, 1331b, 1331c (collectively referenced as 1331). Alternatively or additionally, the discrete buttons can comprise one or more hardware buttons (e.g., displaceable buttons for actuating associated switches). In the illustrated example, the capacitive touch buttons 1330 include a presets/recents modal button 1330a, a skip forward button 1330b, and a skip back button 1330c.

When in presets mode, the inner ring 1324 serves as the absolute location of a plurality of preset indicators 1332 (six shown). When in recents mode, a circular swiping motion along the inner ring 1324 allows the user to browse the recents via the display 1328, and select a recent, for playback on the audio playback device 1300, by pressing down on the inner ring 1324.

The center button 1326 includes a circular lens that masks the display 1328. A central push on the center button 1326 can power on or pause and unpause the audio playback device's audio. A press-and-hold on the center button 1326 shuts down the audio playback device 1300.

A capacitive touch circuit 1334 is positioned beneath the inner ring 1324 and is utilized for sensing a position of a user's finger on the inner ring 1324. The audio playback device 1300 also includes a switch 1336 (e.g., a snap dome switch) that is positioned beneath the center button 1326 and display 1328.

In the illustrated example, the inner ring 1324 and the center button 1326 are integrated in a common assembly an configured such that the switch 1336 can be actuated by pressing centrally on the center button 1326, or by pressing on the inner ring 1324 (e.g., pressing on one of the preset indicators 1332). The assembly is configured so that there is enough travel at the preset indicators 1332 such that the switch 1336 is always being actuated when one of the preset indicators 1332 is pressed, and, such that, from a user's perspective, there is not a huge difference between the feel of hitting the center of the center button 1326 or the preset indicators 1332 along the edges.

When the user presses down on the inner ring 1324, the user interface will receive input from the capacitive touch circuit 1334 indicating the relative position of the user's finger on the inner ring 1324 (e.g., which can be used to determine which one of the preset indicators 1332 the user is pressing) in combination with input indicating the actuation of the switch 1336. The user interface is configured to interpret actuation of the switch 1336 in combination with input from the capacitive touch circuit 1334 indicating a position of a user's finger on the inner ring 1324 as selection of a preset, if the device is operating in the presets mode; or as selection of a recent, if the device is operating in the recents mode. In some cases, the user interface can include its own dedicated processor for interpreting user input. Alternatively, the user interface may utilize the audio playback device's processor for interpreting user input.

A central press on the center button 1326 will also actuate the switch 1336. The user interface is configured to interpret actuation of the switch 1336, in the absence of input from the capacitive touch circuit 1334 indicating a position of a user's finger on the inner ring, as selection of a function associated with the center button 1326.

The user interface is also configured to interpret input from the capacitive touch circuit 1334 indicating a position of a user's finger relative to the inner ring 1324, in the absence of input indicating actuation of the switch 1336, as a user request to preview information regarding one of the entities.

The user interface may also include a proximity detector for detecting the presence of a user's hand near the surface of the user interface. The proximity detector may include a proximity sensor 1338 and a pair of infrared emitters 1340 all mounted below the lens. The emitters 1340 fire upward through the lens, and, when IR is reflected (e.g., off a user's hand reaching toward the audio playback device 1300), the proximity sensor 1338 picks that up. The proximity detector can be utilized to allow the user interface to "wake up" (i.e., power up) from a low power (a/k/a "sleep") mode.

The user interface may be configured to enter the low power mode (e.g., in which the display 1328 and/or capacitive touch circuit 1334 is powered off to conserve energy) after a predetermined period (e.g., 5 seconds to 15 seconds) of non-use. The proximity detector can then be utilized to trigger the user interface to power up from the low power mode when the presence of the user is detected.

The proximity detector functions such that the user interface wakes up (i.e., enters a normal power state, e.g., in which the one or functions that were deactivated when entering the low power mode are re-activated) when a user goes to use it without actually having to touch the user interface; i.e., so that the user's first contact with the user interface can be used for content (e.g., music) selection. In that regard, the proximity detector can also help to facilitate "one touch" access to music. The idea here is that the user's actions wake the user interface up from a sleep or low power mode before the user actually contacts the user interface so that the user can access content (e.g., music) with the user's first touch (e.g., by pressing one of the preset indicators 1332, FIG. 13A).

A screen 1342 conceals one or more electro-acoustic transducers (item 215, FIG. 2C). The audio playback device 1300 also includes a network interface, a processor, memory, and audio hardware such as described above with reference to FIG. 2C. The user interface for the audio playback device 1300 may also include the various elements, such as the support ring, spring arms, and engagement members and described with reference to FIGS. 7A-7E for facilitating rotation of the volume ring. The user interface for the remote control device may also include the elements, such as the optical sensors, described with reference to FIGS. 9A-9B for facilitating detection of rotation of the volume ring.

A number of implementations have been described. Nevertheless, it will be understood that additional modifications may be made without departing from the scope of the inventive concepts described herein, and, accordingly, other implementations are within the scope of the following claims.

What is claimed is:

1. A user interface comprising:
  a rotatable ring for controlling a function on an associated device;
  a support ring for supporting the rotatable ring;
  the support ring comprising:
  a plurality of biasing elements; and
  a plurality of engagement members rotatably mounted on the biasing elements and configured to engage the rotatable ring so as to preload the biasing elements and thereby (i) biasing the rotatable ring toward a center position in which a central axis of the rotatable ring is coincident with a central axis of the support ring, and (ii) increasing resistance to rotational movement of the rotatable ring,
  wherein at least one of the engagement members comprises:
  a wheel rotatable relative to an associated one of the biasing elements: and
  a complaint member disposed about an outer diameter of the wheel.

2. The user interface of claim 1, wherein the rotatable ring comprises an encoded pattern and the user interface further comprises one or more sensors for reading the encoded pattern to sense rotational movement of the rotatable ring.

3. The user interface of claim 1, wherein the rotatable ring is rotatable to control audio volume on an associated audio playback device.

4. The user interface of claim 1, wherein the support ring defines a grease trough for retaining grease.

5. The user interface of claim 4, wherein the rotatable ring comprises a rib that is configured to rotate within the trough.

6. The user interface of claim 1, wherein the biasing elements comprise spring arms.

7. A remote control device comprising the user interface of claim 1.

8. The remote control device of claim 7, further comprising a wireless interface for communicating with an associated audio playback device.

9. The remote control device of claim 8, wherein the wireless interface is configured to communicate with an associated audio playback device via a Bluetooth protocol.

10. An audio playback device comprising the user interface of claim 1.

11. A user interface comprising:
  a plurality of concentrically arranged user interface elements comprising:
  a volume ring;
  a middle ring comprising a plurality of discrete buttons;
  an inner ring comprising an position sensor;
  a center button comprising a display; and
  a support ring for supporting the volume ring, the support ring comprising:
  a plurality of biasing elements; and
  a plurality of engagement members mounted for rotation on the biasing elements and configured to engage the volume ring so as to preload the biasing elements and thereby (i) biasing the volume ring toward a center position in which an axis of rotation of the volume ring is coincident with a central axis of the support ring, and (ii) increasing resistance to rotational movement of the volume ring,
  wherein the inner ring circumferentially surrounds the center button, the middle ring circumferentially surrounds the inner ring, and the volume ring circumferentially surrounds the middle ring, and
  wherein at least one of the engagement members comprises:
  a wheel rotatable relative to an associated one of the spring arms; and
  a compliant member disposed about an outer diameter of the wheel.

12. The user interface of claim 11, wherein the volume ring can be activated by rotating the volume ring to adjust the audio volume of an associated audio playback device.

13. The user interface of claim 11, wherein the biasing elements comprise spring arms.

14. The user interface of claim 11, wherein the volume ring comprises an encoded pattern and the user interface further comprises at least one sensor for reading the encoded pattern to sense rotational movement of the volume ring.

15. The user interface of claim 11, wherein the volume ring is rotatable to control audio volume on an associated audio playback device.

16. The user interface of claim 11, wherein the support ring comprises a grease trough for retaining grease.

17. The user interface of claim 16, wherein the volume ring comprises a rib that is configured to rotate within the grease trough.

18. The user interface of claim 11, wherein the plurality of discrete buttons comprise a plurality of capacitive touch buttons.

19. The user interface of claim 18, wherein at least one of the capacitive touch buttons comprises a backlit icon.

20. The user interface of claim 11, wherein the plurality of discrete buttons comprise a presets/recents modal button for toggling between a preset mode in which a user can access presets, wherein the presets are a set of user-defined shortcuts to entities for providing content, and a recents mode in which a user can access a list of previously accessed entities for providing content.

21. The user interface of claim 11, wherein the plurality of discrete buttons comprise: (i) a skip forward button, and (ii) a skip back button.

22. The user interface of claim 11, wherein the inner ring comprises an position sensor for sensing a position of a user's finger on a surface of the inner ring.

23. The user interface of claim 22, wherein the inner ring operates as an absolute location of a plurality of preset indicators.

24. The user interface of claim 23, wherein the center button is displaceable to actuate a switch,
wherein the user interface is configured to interpret actuation of the switch, in the absence of input from the position sensor indicating a position of a user's finger relative to the inner ring, as selection of a function associated with the center button, and
wherein the user interface is configured to interpret actuation of the switch in combination with input from the position sensor indicating a position of a user's finger relative to the inner ring as selection of a preset.

25. The user interface of claim 22, wherein a circular swiping motion along the position sensor allows a user to browse a recents list, wherein the recents list is a list of entities that is populated from content that the user has chosen to play on one or more audio playback devices.

26. The user interface of claim 25, wherein the center button is displaceable to actuate a switch,
wherein the user interface is configured to interpret actuation of the switch, in the absence of input from the position sensor indicating a position of a user's finger relative to the inner ring, as selection of a function associated with the center button, and
wherein the user interface is configured to interpret actuation of the switch in combination with input from the position sensor indicating a position of a user's finger relative to the inner ring as selection of an entity from the list of entities.

27. The user interface of claim 22, wherein the user interface is operable in a presets mode and a recents mode,
wherein, when the user interface is in the presets mode, the inner ring operates as an absolute location of a plurality of preset indicators, and
wherein, when the user interface is in a recents mode, a circular swiping motion along the position sensor allows a user to browse a recents list, wherein the recents list is a list of entities that is populated from content that the user has chosen to play on one or more audio playback devices.

28. The user interface of claim 11, wherein the center button comprises a lens which covers the display.

29. The user interface of claim 11, wherein a central push on the center button can be actuated to (i) power on an associated audio playback device or (ii) to pause and unpause a rendering of audio on an associated audio playback device.

30. The user interface of claim 11, wherein a press-and-hold on the center button shuts down an associated audio playback device.

31. The user interface of claim 11, wherein the center button is displaceable to actuate a switch.

32. The user interface of claim 31, wherein the switch comprises a snap dome.

33. The user interface of claim 31, wherein the user interface is configured to interpret actuation of the switch, in the absence of input from the inner ring, as selection of a function associated with the center button.

34. The user interface of claim 31, wherein the user interface is configured to interpret actuation of the switch in combination with input from inner ring as selection of a preset.

35. The user interface of claim 31, wherein the user interface is configured to interpret actuation of the switch in combination with input from the position sensor indicating a position of a user's finger relative to the inner ring as selection of an entity from a recents list, wherein the recents list is a list of entities that is populated from content that the user has chosen to play on one or more audio playback devices within an audio system.

36. The user interface of claim 11, wherein the user interface is configured to display, on the display, information relating to an entity for providing content to be rendered on an associated audio playback device.

37. The user interface of claim 36, wherein the information comprises an identification of an audio source with which the entity is associated, and metadata associated with the entity.

38. The user interface of claim 37, wherein the identification of the audio source comprises an icon associated with the audio source.

39. The user interface of claim 36, wherein the displayed information relates to an entity currently providing content for rendering on an associated audio playback device.

40. The user interface of claim 36, wherein the displayed information relates to an entity assigned to one of a plurality of preset indicators on the inner ring, wherein the plurality of preset indicators one the inner ring correspond to a set of preset indicators on an associated audio playback device.

41. The user interface of claim 36, wherein the displayed information relates to an entity selected from a recents list, wherein the recents list is a list of entities that is populated from content that the user has chosen to play on one or more audio playback devices within an audio system.

42. A remote control device comprising the user interface of claim 11.

43. The remote control device of claim 42, wherein the remote control device comprises a wireless interface for communicating with an associated audio playback device.

44. The remote control device of claim 43, wherein the wireless interface is configured to communicate with an associated audio playback device via a Bluetooth protocol.

45. The remote control device of claim 42, wherein the remote control device further comprises a proximity detector,
wherein the remote control device is configured to enter a low power state, in which one or more functions are deactivated, after a period of non-use, and
wherein the remote control device is configured to re-activate the one or more deactivated functions in response to the proximity detector detecting a user's hand near a surface of the remote control device.

46. An audio playback device comprising the user interface of claim 11.

47. A system comprising:
a remote control device comprising the user interface of claim 11, the remote control device further comprising a battery door comprising a metal portion, and a notch; and
a mount configured to be mounted on a wall and comprising a magnet for attracting the metal portion of the battery door, and a tab for engaging the notch in the battery door for orientation of the remote control device relative to the mount.

* * * * *